(12) United States Patent
Gao et al.

(10) Patent No.: US 12,349,580 B2
(45) Date of Patent: Jul. 1, 2025

(54) MOTHER BOARD WITH IMPROVED WATER RESISTANCE FOR DISPLAY PANEL, DISPLAY PANEL, AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Xinwei Gao, Beijing (CN); Peng Li, Beijing (CN); Shuai Zhang, Beijing (CN)

(73) Assignees: Hefei BOE Joint Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/997,027

(22) PCT Filed: Oct. 29, 2021

(86) PCT No.: PCT/CN2021/127263
§ 371 (c)(1),
(2) Date: Oct. 24, 2022

(87) PCT Pub. No.: WO2023/070489
PCT Pub. Date: May 4, 2023

(65) Prior Publication Data
US 2024/0237484 A1 Jul. 11, 2024

(51) Int. Cl.
*H10K 59/80* (2023.01)
*H10K 59/122* (2023.01)

(52) U.S. Cl.
CPC ......... *H10K 59/873* (2023.02); *H10K 59/122* (2023.02)

(58) Field of Classification Search
CPC .............. H10K 59/873; H10K 59/122; H10K 50/8426; H10K 59/00
(Continued)

(56) References Cited

U.S. PATENT DOCUMENTS

2015/0102293 A1* 4/2015 Cho ........................ H10K 50/84
257/40
2019/0165312 A1 5/2019 Bae et al.
(Continued)

FOREIGN PATENT DOCUMENTS

| CN | 101459086 A | 6/2009 |
|----|-------------|--------|
| CN | 105449113 A | 3/2016 |

(Continued)

OTHER PUBLICATIONS

International Search Report and Written Opinion dated Jul. 18, 2022, for corresponding PCT Application No. PCT/CN2021/127263.

*Primary Examiner* — Nduka E Ojeh
(74) *Attorney, Agent, or Firm* — Kinney & Lange, P.A.

(57) ABSTRACT

A mother board for a display panel, having a bonding region and a first panel region including a retaining region and a peripheral region, in which: a first light-emitting functional layer is located in the first panel region; a first adhesive layer surrounding the first panel region is adhered to a cover plate and a base substrate, and an orthographic projection of an edge of the first adhesive layer close to the bonding region on the base substrate defines a first pattern; the first light-emitting functional layer in the retaining region and the peripheral region are spaced by a first spacing layer, an orthographic projection of which on the base substrate partially overlaps with the first pattern and form a closed second pattern therewith. The orthographic projection of the
(Continued)

first spacing layer on the base substrate is located within that of the first adhesive layer on the base substrate.

20 Claims, 11 Drawing Sheets

(58) Field of Classification Search
USPC .................................................. 257/88, 40
See application file for complete search history.

(56) References Cited

U.S. PATENT DOCUMENTS

| | | | |
|---|---|---|---|
| 2020/0135800 A1* | 4/2020 | Seo | .............. H10K 59/8722 |
| 2020/0168848 A1 | 5/2020 | Jung et al. | |
| 2021/0028251 A1 | 1/2021 | Yang et al. | |
| 2021/0043872 A1 | 2/2021 | Gao | |
| 2021/0104555 A1 | 4/2021 | Kwak et al. | |
| 2021/0167149 A1 | 6/2021 | Zhao et al. | |
| 2022/0199693 A1* | 6/2022 | Wei | .............. H10K 59/8723 |
| 2022/0407031 A1 | 12/2022 | Li et al. | |
| 2023/0105154 A1 | 4/2023 | Sun | |

FOREIGN PATENT DOCUMENTS

| | | |
|---|---|---|
| CN | 105632339 A | 6/2016 |
| CN | 105870147 A | 8/2016 |
| CN | 106064880 A | 11/2016 |
| CN | 108470760 A | 8/2018 |
| CN | 108538862 A | 9/2018 |
| CN | 110164945 A | 8/2019 |
| CN | 110265474 A | 9/2019 |
| CN | 110429207 A | 11/2019 |
| CN | 111477770 A | 7/2020 |
| CN | 112467054 A | 3/2021 |
| CN | 113540201 A | 10/2021 |
| IN | 109728196 A | 5/2019 |
| KR | 20200060654 A | 6/2020 |

* cited by examiner

![US 12,349,580 B2]

MOTHER BOARD WITH IMPROVED WATER RESISTANCE FOR DISPLAY PANEL, DISPLAY PANEL, AND DISPLAY DEVICE

CROSS-REFERENCE TO RELATED APPLICATION(S)

This application is a Section 371 National Stage Application of International Application No. PCT/CN2021/127263, filed on Oct. 29, 2021, the whole disclosure of which is incorporated herein by reference in its entirety.

TECHNICAL FIELD

The present disclosure relates to a field of a display technology, and in particular to a mother board for a display panel, a display panel, and a display device.

BACKGROUND

With a development of a display screen technology, in addition to a requirement for traditional functions such as an information display of a display screen, a requirement for an appearance of a display screen is also gradually improving in order to better adapt to an overall structure and a use requirement of an environment, and then a special-shaped display screen is generated. The special-shaped display screen is a display screen with a special shape that is transformed on the basis of a traditional display screen, so as to make characteristics of the display screen better meet a customer's requirements.

SUMMARY

The present disclosure provides a mother board for a display panel, a display panel and a display device.

According to a first aspect of the present disclosure, a mother board for a display panel is provided, the mother board for the display panel having a first panel region and a bonding region on a side of the first panel region, wherein the first panel region has a retaining region and a peripheral region located outside the retaining region; the mother board for the display panel includes: a base substrate, a cover plate arranged opposite to the base substrate, a first light-emitting functional layer, a first adhesive layer, and a first spacing layer arranged between the base substrate and the cover plate; wherein the first light-emitting functional layer is located in the first panel region; wherein the first adhesive layer surrounds the first panel region and is adhered to the cover plate and the base substrate, and an orthographic projection of an edge of the first adhesive layer on a side of the first adhesive layer close to the bonding region on the base substrate defines a first pattern; and wherein the first spacing layer is located at an edge of the retaining region, and the first light-emitting functional layer in the retaining region is spaced from the first light-emitting functional layer in the peripheral region by the first spacing layer, an orthographic projection of the first spacing layer on the base substrate partially overlaps with the first pattern and forms a second pattern with the first pattern; wherein the second pattern is a closed pattern, and the orthographic projection of the first spacing layer on the base substrate is located within a range of a pattern defined by an orthographic projection of the first adhesive layer on the base substrate.

According to the embodiments of the present disclosure, the retaining region includes a display region; wherein the first spacing layer includes a first partition part and a second partition part, the first partition part is arranged along an edge of the display region, a first end of the second partition part is connected to the first partition part, and an orthographic projection of a second end of the second partition part on the base substrate partially overlaps with the first pattern; and wherein the second end of the second partition part is located between the first adhesive layer and the base substrate.

According to the embodiments of the present disclosure, the retaining region further includes a wiring region arranged on a side of the display region close to the bonding region, the mother board for the display panel further includes a plurality of pixel units and connection signal lines, the plurality of pixel units are located in the display region, a first end of the connection signal line is connected to the pixel unit, and the other end of the connection signal line passes through the wiring region and is connected to a bonding end in the bonding region; and the second partition part is located on a first side and a second side of the wiring region, the first side and the second side of the wiring region are arranged in a first direction intersecting a direction from the display region to the bonding region.

According to the embodiments of the present disclosure, in the direction from the display region to the bonding region, a size of an overlapping portion between the orthographic projection between of the second end of the second partition part on the base substrate and the first pattern is greater than or equal to 45 µm.

According to the embodiments of the present disclosure, the edge of the first adhesive layer close to the bonding region is a first edge, the first adhesive layer further includes a second edge arranged opposite to the first edge and a third edge located between the first edge and the second edge, and the orthographic projection of the first spacing layer on the base substrate does not overlap with an orthographic projection of the second edge on the base substrate and an orthographic projection of the third edge on the base substrate.

According to the embodiments of the present disclosure, the mother board for the display panel further includes a second spacing layer arranged in the same layer as the first spacing layer, wherein the second spacing layer includes a third partition part and a fourth partition part located on a side of the third partition part away from the display region, the third partition part is located in the peripheral region, an orthographic projection of the fourth partition part on the base substrate overlaps with the orthographic projection of the second edge on the base substrate and the orthographic projection of the third edge on the base substrate, and the fourth partition part is located between the base substrate and the first adhesive layer.

According to the embodiments of the present disclosure, the first spacing layer is strip-shaped, the first spacing layer includes at least one strip-shaped part, and each strip-shaped part includes a first portion on a side close to the cover plate, a second portion on a side close to the base substrate, and a third portion located between the first portion and the second portion; and a cross-sectional area of the first portion is larger than a cross-sectional area of the third portion.

According to the embodiments of the present disclosure, a cross-sectional area of the second portion is greater than the cross-sectional area of the third portion; or a cross-sectional area of the second portion is smaller than the cross-sectional area of the third portion.

According to the embodiments of the present disclosure, each strip-shaped part includes a first strip-shaped sub-part and a second strip-shaped sub-part abutting the first strip-shaped sub-part, and the first strip-shaped sub-part and the second strip-shaped sub-part are arranged in a width direction of the first spacing layer; and wherein the second strip-shaped sub-part protrudes with respect to a surface of the first strip-shaped sub-part on a side of the first strip-shaped sub-part away from the base substrate.

According to the embodiments of the present disclosure, a cross-sectional area of the first strip-shaped sub-part gradually increases and a cross-sectional area of the second strip-shaped sub-part gradually decreases in a direction close to the base substrate.

According to the embodiments of the present disclosure, the number of the strip-shaped part is more than one, the strip-shaped parts are spaced apart from each other, and the strip-shaped parts are arranged in a width direction of the first spacing layer.

According to the embodiments of the present disclosure, the mother board for the display panel further includes a third spacing layer arranged in the same layer as the first spacing layer, wherein the third spacing layer is located in the peripheral region, and the third spacing layer includes a plurality of fifth partition parts nested with each other and spaced apart from each other.

According to the embodiments of the present disclosure, each fifth partition part includes a plurality of partition sub-parts spaced apart from each other; or an orthographic projection of each fifth partition part on the base substrate is a continuous pattern.

According to the embodiments of the present disclosure, the mother board for the display panel further includes a pixel circuit layer and a pixel definition layer arranged on a side of the first light-emitting functional layer close to the base substrate, wherein the pixel definition layer is located between the first light-emitting functional layer and the pixel circuit layer; wherein the first spacing layer is arranged in the same layer as the pixel definition layer; or the first spacing layer is arranged in the same layer as one of metal film layers in the pixel circuit layer.

According to the embodiments of the present disclosure, a distance between an outer edge of the orthographic projection of the first spacing layer on the base substrate and an orthographic projection of the display region on the base substrate is greater than or equal to 850 μm.

According to the embodiments of the present disclosure, the first light-emitting functional layer includes a first light-emitting functional sub-layer located in the retaining region, a second light-emitting functional sub-layer located in the peripheral region, and a third light-emitting functional sub-layer located between the retaining region and the peripheral region; and wherein the third light-emitting functional sub-layer is located on a side of the first spacing layer away from the base substrate, and the first light-emitting functional sub-layer, the second light-emitting functional sub-layer and the third light-emitting functional sub-layer are spaced apart from each other.

According to the embodiments of the present disclosure, the mother board for the display panel further includes: a first electrode arranged on a side of the first light-emitting functional layer away from the base substrate, and a planarization layer arranged on a side of the first electrode away from the base substrate, wherein the first electrode and the planarization layer are located in the first panel region; and the first electrode in the retaining region is spaced from the first electrode in the peripheral region by the first spacing layer, and the planarization layer in the retaining region is spaced from the planarization layer in the peripheral region by the first spacing layer.

According to the embodiments of the present disclosure, the mother board for the display panel further includes a first encapsulation layer arranged on a side of the planarization layer away from the base substrate, wherein the first encapsulation layer extends continuously from the retaining region to the peripheral region.

According to the embodiments of the present disclosure, the mother board for the display panel further includes a second adhesive layer arranged between the cover plate and the first encapsulation layer, wherein the second adhesive layer is located in the first panel region.

According to the embodiments of the present disclosure, the retaining region includes a display region and a wiring region arranged on a side of the display region close to the bonding region; the mother board for the display panel further includes a plurality of pixel units and connection signal lines, the plurality of pixel units are located in the display region, a first end of the connection signal line is connected to the pixel unit, and a second end of the connection signal line passes through the wiring region and is connected to a bonding end in the bonding region; and the first adhesive layer is further adhered to the connection signal line.

A second aspect of the present disclosure provides a display panel, the display panel having a second panel region and a bonding region on a side of the second panel region; wherein the display panel includes: a base substrate, a cover plate arranged opposite to the base substrate, a second light-emitting functional layer, a second spacing layer, and a third adhesive layer arranged between the base substrate and the cover plate; wherein the third adhesive layer is located between the second panel region and the bonding region and is adhered to the cover plate and the base substrate, the second light-emitting functional layer is located in the second panel region, the second spacing layer is located at an edge of the second panel region, an orthographic projection of the second spacing layer on the base substrate partially overlaps with an orthographic projection of the third adhesive layer on the base substrate and the orthographic projection of the second spacing layer on the base substrate and the orthographic projection of the third adhesive layer on the base substrate enclose to form a third pattern, wherein the third pattern is a closed pattern, and the orthographic projection of the second spacing layer on the base substrate does not exceed an edge of the orthographic projection of the third adhesive layer on the base substrate on a side away from an orthographic projection of the second panel region on the base substrate.

According to the embodiments of the present disclosure, the second panel region includes a display region; wherein the second spacing layer includes a sixth partition part and a seventh partition part, the sixth partition part is arranged along an edge of the display region, a first end of the seventh partition part is connected to the sixth partition part, and an orthographic projection of a second end of the seventh partition part on the base substrate partially overlaps with the orthographic projection of the third adhesive layer on the base substrate; and wherein the second end of the seventh partition part is located between the third adhesive layer and the base substrate.

According to the embodiments of the present disclosure, the second panel region further includes a wiring region arranged on a side of the display region close to the bonding region, the display panel further includes a plurality of pixel units and connection signal lines, the plurality of pixel units are located in the display region, a first end of the connection signal line is connected to the pixel unit, and the other end of the connection signal line passes through the wiring region and is connected to a bonding end in the bonding region; and the seventh partition part is located on a first side and a second side of the wiring region, the first side and the second side of the wiring region are arranged in a first direction intersecting a direction from the display region to the bonding region.

According to the embodiments of the present disclosure, the display panel further includes: a second encapsulation layer arranged on a side of the second light-emitting functional layer away from the base substrate, wherein the second encapsulation layer and the second spacing layer form an encapsulation structure of the display panel, and the encapsulation structure is configured to separate the second light-emitting functional layer in the display panel from an outside.

A third aspect of the present disclosure provides a display device including the display panel as described above.

BRIEF DESCRIPTION OF THE DRAWINGS

The above and other objectives, features and advantages of the present disclosure will be more apparent through the following descriptions of embodiments of the present disclosure with reference to the accompanying drawings.

FIG. 4c schematically shows a first enlarged view at a position D in FIG. 4a;

FIG. 6 schematically shows a second enlarged view at the position D in FIG. 4a;

DETAILED DESCRIPTION OF EMBODIMENTS

Figure 1A:
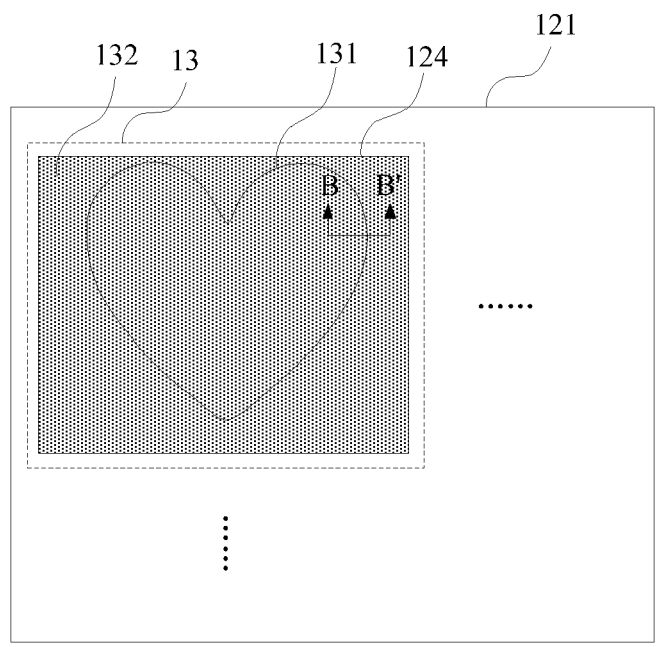
FIG. 1a schematically shows a plan view of a mother board for a display panel in a comparative example.

In order to make objectives, technical solutions and advantages of the present disclosure clearer, the technical solutions of embodiments of the present disclosure are clearly and completely described below with reference to the drawings. Obviously, the described embodiments are only some embodiments of the present disclosure, rather than all embodiments. Based on the described embodiments of the present disclosure, all additional embodiments obtained by those ordinary skilled in the art without carrying out inventive effort fall within the scope of protection of the present disclosure.

It should be noted that, in the drawings, for clarity and/or description purposes, sizes and relative sizes of elements may be enlarged. Accordingly, the size and relative size of each element need not to be limited to those shown in the drawings. In the specification and drawings, the same or similar reference numerals indicate the same or similar components.

When an element is described as being "on", "connected to" or "coupled to" another element, the element may be directly on the another element, directly connected to the another element, or directly coupled to the another element, or an intermediate element may be provided. However, when an element is described as being "directly on", "directly connected to" or "directly coupled to" another element, no intermediate element is provided. Other terms and/or expressions used to describe a relationship between elements, such as "between" and "directly between", "adjacent" and "directly adjacent", "on" and "directly on", and so on, should be interpreted in a similar manner. In addition, the term "connection" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XY, YZ and XZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from teachings of the present disclosure.

For ease of description, spatial relationship terms, such as "upper", "lower", "left", "right", may be used herein to describe a relationship between one element or feature and another element or feature as shown in the drawings. It should be understood that the spatial relationship terms are intended to cover other different orientations of a device in use or operation in addition to the orientation described in the drawings. For example, if the device in the drawing is turned upside down, an element or feature described as "below" or "under" another element or feature will be oriented "above" or "on" the another element or feature.

Those skilled in the art should understand that herein, unless otherwise specified, the expression "thickness" refers to a size in a direction perpendicular to a surface of the display substrate provided with various film layers, that is, a size in a light exit direction of the display substrate.

In the present disclosure, unless otherwise specified, the expression "patterning process" generally includes steps of photoresist coating, exposure, development, etching, photoresist stripping and the like. The expression "one-time patterning process" means a process of forming patterned layers, components, members and so on by using one mask.

It should be noted that the expressions "the same layer", "arranged in the same layer" or similar expressions refer to a layer structure formed by firstly using the same film forming process to form a film layer for forming a specific pattern, and then using the same mask to pattern the film layer by using a one-time patterning process. Depending on different specific patterns, the one-time patterning process may include multiple exposure, development or etching processes, and the specific pattern in the formed layer structure may be continuous or discontinuous. These specific patterns may also be at different heights or have different thicknesses.

In the present disclosure, unless otherwise specified, the expression "electrically connected" may mean that two components or elements are directly electrically connected. For example, a component or element A is in direct contact with a component or element B, and an electrical signal may be transmitted between the two. It may also mean that two components or elements are electrically connected through a conductive medium such as a conductive wire. For example, a component or element A is electrically connected to a component or element B through a conductive wire so as to transmit an electrical signal between the two. Alternatively, it may also mean that two components or elements are electrically connected through at least one electronic element. For example, a component or element A is electrically connected to a component or element B through at least one thin film transistor so as to transmit an electrical signal between the two.

Figure 1B:
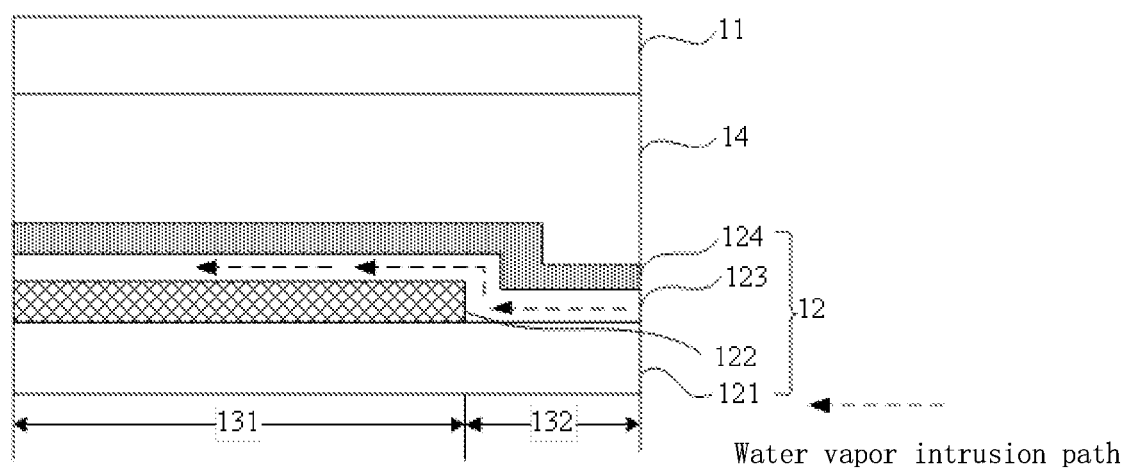
FIG. 1b schematically shows a sectional view of FIG. 1a taken along a section line BB'.

FIG. 1a schematically shows a plan view of a mother board for a display panel in a comparative example. FIG. 1b schematically shows a sectional view of FIG. 1a taken along a section line BB'. With reference to FIG. 1a and FIG. 1b, the mother board for the display panel includes a cover plate 11 and an array substrate 12 that are arranged opposite to each other. The array substrate 12 may include a base substrate 121, and a pixel circuit layer, a light emitting layer 123 and an encapsulation layer 124 sequentially arranged in a direction away from the base substrate 121. The mother board for the display panel is divided into a plurality of first panel regions 13, including a special-shaped display region 131 and a peripheral region 132 located outside the special-shaped display region 131. As shown in FIG. 1a, a shape of the special-shaped display region 131 is different from a shape of a conventional display region. Exemplarily, a common conventional display region is generally rectangular, while the special-shaped display region 131 refers to a non-rectangular display region, such as a "heart-shaped" display region or a "circular" display region. For clarity, FIG. 1a shows only one first panel region 13 on the mother board for the display panel. In fact, a plurality of first panel regions 13 may be provided on the mother board for the display panel, and the number may be determined according to actual needs, which is not limited here. After a preparation of the mother board for the display panel is completed, a rough cutting may be performed on the mother board for the display panel along the first panel region 13 to obtain an initial display panel, and then a fine cutting may be performed along the special-shaped display region 131 to obtain a special-shaped display panel.

At present, when preparing the above-mentioned mother board for the display panel, the light emitting layer 123 is generally formed by an evaporation process, and the encapsulation layer 124 is generally formed by a chemical vapor deposition (CVD) or an ink jet printing (IJP). In an ideal situation, it is desired to form the light emitting layer 123 and the encapsulation layer 124 in the special-shaped display region 131. However, since the special-shaped display region 131 has a special shape, and a pattern of a mask used in the above-mentioned process is generally rectangular, it is difficult to accurately form the light emitting layer 123 and the encapsulation layer 124 in the special-shaped display region 131 through the above-mentioned process. To solve this problem, in this comparative example, in addition to forming the light emitting layer 123 and the encapsulation layer 124 in the special-shaped display region 131, the light emitting layer 123 and the encapsulation layer 124 are further formed outside the special-shaped display region 131 (that is, in the peripheral region 132). However, the mother board for the display panel prepared using the above-mentioned method is prone to a package failure when cutting.

For example, as shown in FIG. 1b, the cover plate 11 and the array substrate 12 of the mother board for the display panel are generally adhered together by an adhesive 14. As the encapsulation layer 124 is not only located in the special-shaped display region 131, but also in the peripheral region 132, the adhesive 14 actually bonds the encapsulation layer 124 in the array substrate 12 with the cover plate 11 when a traditional bonding method is used for bonding. Due to a low adhesive force between the encapsulation layer 124 and the base substrate 121, the encapsulation layer 124 is easy to be separated from the base substrate 121 during cutting. When the encapsulation layer 124 is separated from the base substrate 121, the cover plate 11 may be separated from the array substrate 12, which may lead to a package failure.

For another example, the light emitting layer 123 has a certain water absorption. When the light emitting layer 123 is located in the peripheral region 132, the light emitting layer 123 may become a medium of water and oxygen intrusion, which may also lead to the package failure.

Figure 2A:
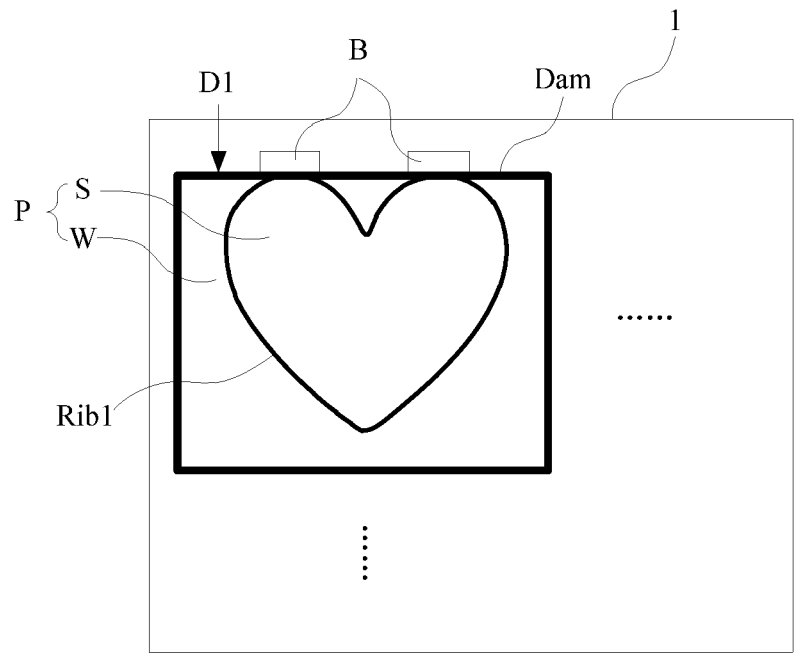
FIG. 2a to FIG. 2c schematically show plan views of a mother board for a display panel according to the embodiments of the present disclosure.
Figure 2B:
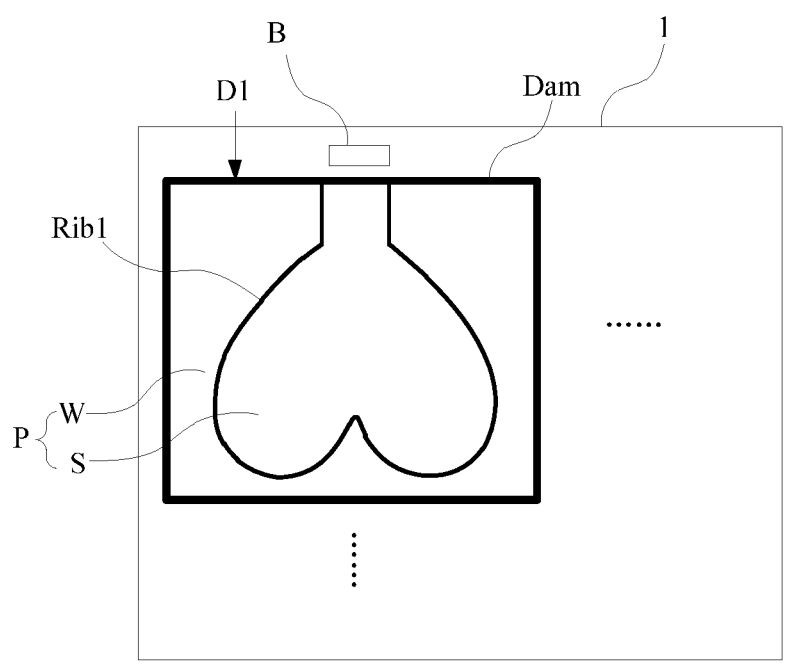
Figure 2C:
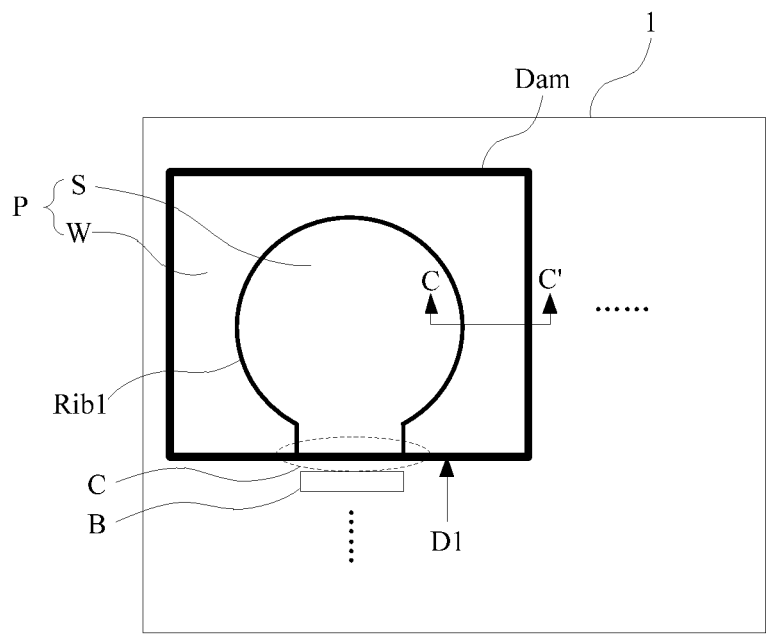
Figure 3A:
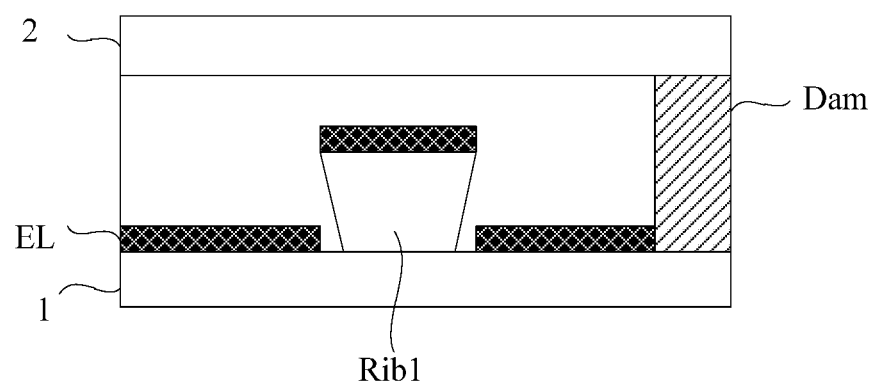
FIG. 3a schematically shows a sectional view of FIG. 2c taken along a section line CC'.

In view of this, embodiments of the present disclosure provide a mother board for a display panel. FIG. 2a to FIG. 2c schematically show plan views of a mother board for a display panel according to the embodiments of the present disclosure. FIG. 3a schematically shows a sectional view of FIG. 2c taken along a section line CC'. For clarity, a first light-emitting functional layer is hidden in FIG. 2a to FIG. 2c. With reference to FIG. 2a to FIG. 3a, the mother board for the display panel has a first panel region P and a bonding region B on a side of the first panel region P. The first panel region P has a retaining region S and a peripheral region W outside the retaining region S. The mother board for the display panel includes: a base substrate 1, a cover plate 2 arranged opposite to the base substrate 1, a first light-emitting functional layer EL arranged between the base substrate 1 and the cover plate 2, a first adhesive layer Dam, and a first spacing layer Rib1. A material of the base substrate 1 and the cover plate 2 may contain a flexible material or a rigid material. For example, when the material of the base substrate 1 is a flexible material, the flexible material may include polyimide or the like; when the material of the base substrate 1 is a rigid material, the rigid material may include glass or the like. The first light-emitting functional layer EL may be an organic electroluminescent functional layer, and the first light-emitting functional layer EL may have a multi-layer structure. For example, the first light-emitting functional layer EL may have a multi-layer structure including a hole injection layer, a hole transport layer, an organic light emitting layer, an electron transport layer and an electron injection layer. The first light-emitting functional layer EL is located in the first panel region P. For example, the first light-emitting functional layer EL is located in the retaining region S and the peripheral region W. The first adhesive layer Dam surrounds the first panel region P and is adhered to the cover plate 2 and the base substrate 1. An orthographic projection of an edge (a first edge D1) of the first adhesive layer Dam close to the bonding region B on the base substrate 1 defines a first pattern, which may be, for example, a straight line. The first spacing layer Rib1 is located at an edge of the retaining region S and spacing the first light-emitting functional layer EL in the retaining region S from the first light-emitting functional layer EL in the peripheral region W. An orthographic projection of the first spacing layer Rib1 on the base substrate 1 partially overlaps with the first pattern, and forms a second pattern with the first patter. The second pattern is a closed pattern. In this way, the first spacing layer Rib1 may enclose the edge of the retaining region S, so as to completely space the first light-emitting functional layer EL in the retaining region S from the first light-emitting functional layer EL in the peripheral region W, thus cutting off a water vapor intrusion path formed by an extension of the first light-emitting functional layer EL to the peripheral region W.

In embodiments of the present disclosure, the mother board for the display panel may have a plurality of first panel regions P which may be arranged in an array. A side of each first panel region P is provided with a bonding region B corresponding to the first panel region P. Optionally, a specific side of the first panel region P on which the bonding region B is provided may be determined according to actual needs, which is not limited here. For example, as shown in FIG. 2a and FIG. 2b, the bonding region B is located above the first panel region P. For another example, as shown in FIG. 2c, the bonding region B is located below the first panel region P. A connection signal line extending from the first panel region P may be connected to a driver chip through the bonding region B, so that a light emitting device in the first panel region may display under a driving of the driver chip.

In the embodiments of the present disclosure, a region defined by the first panel region P and the bonding region B is a portion required to be retained after the rough cutting of the mother board for the display panel is performed, and a region defined by the peripheral region W is a portion required to be removed after the fine cutting of the mother board for the display panel is performed. The retaining region S is a special-shaped region (i.e., a non-rectangular region). For example, as shown in FIG. 2a and FIG. 2b, the retaining region S may be a region similar to a "heart shape", or as shown in FIG. 2c, the retaining region S is a region similar to a "circle", etc. The first adhesive layer Dam may be a dam adhesive, which may have a certain water resistance. The first adhesive layer Dam surrounds the first panel region P. A shape of the first panel region P may be determined according to actual needs, which is not limited here. For example, the first panel region P may be square, and the first adhesive layer Dam provided around the first panel region P may be a square ring structure. Generally, no additional structure is provided between the cover plate 2 and the base substrate 1 at the edge of the first panel region P. In other words, although the first light-emitting functional layer EL and the encapsulation layer of the mother board for the display panel may extend beyond the retaining region S, they may not extend beyond the first panel region P. Therefore, the first adhesive layer Dam may be directly adhered to the base substrate 1 and the cover plate 2. In this way, when cutting the mother board for the display panel, the adhesive may firmly adhere the base substrate 1 and the cover plate 2 together without separation or displacement.

The mother board for display panel shown in FIG. 2c is illustrated below by way of example to describe a specific arrangement of the first panel region in the mother board for the display panel in the embodiments of the present disclosure. With reference to FIG. 2c and FIG. 3a, in the embodiments of the present disclosure, the first spacing layer Rib1 may be formed first, and then the first light-emitting functional layer EL may be formed. In this way, when the first light-emitting functional layer EL is formed, the first light-emitting functional layer EL may be spaced by the first spacing layer Rib1, so that a water vapor intrusion path formed by the first light-emitting functional layer EL is cut off to avoid a package failure. For example, in the embodiments of the present disclosure, a thickness of the first spacing layer Rib1 may be greater than a thickness of the first light-emitting functional layer EL, while a cross-sectional area of the first spacing layer Rib1 on a side away from the base substrate 1 is larger, so as to facilitate the spacing of the first light-emitting functional layer EL.

Figure 3B:
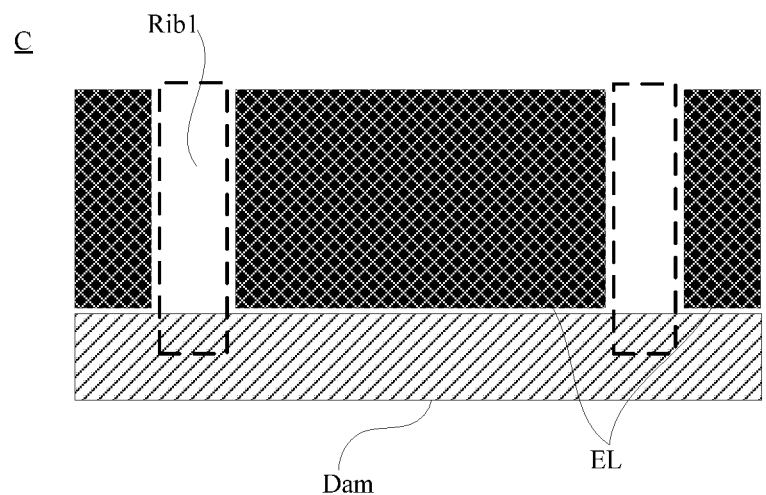
FIG. 3b schematically shows an enlarged view at a position C in FIG. 2c.

FIG. 3b schematically shows an enlarged view at a position C in FIG. 2c. For clarity, the first light-emitting functional layer EL on a side of the first spacing layer Rib1 away from the base substrate 1 is hidden in FIG. 3b. As shown in FIG. 3b, an orthographic projection of the first spacing layer Rib1 on the base substrate 1 partially overlaps with the first pattern. That is, the orthographic projection of the first spacing layer Rib1 on the base substrate 1 partially overlaps with an orthographic projection of an edge of the first adhesive layer Dam close to the bonding region B on the base substrate 1, so as to ensure that the first spacing layer Rib1 may not expose a side surface of the first light-emitting functional layer EL due to a limitation such as a process accuracy, so that a reliability of the first spacing layer Rib1 in isolating water vapor may be improved. It should be noted that the above-mentioned side surface of the first light-emitting functional layer EL refer to left and right side surfaces of the first light-emitting functional layer EL in FIG. 3b.

In the embodiments of the present disclosure, the orthographic projection of the first spacing layer Rib1 on the base substrate 1 is located within a range of a pattern defined by the orthographic projection of the first adhesive layer Dam on the base substrate 1. For example, as shown in FIG. 3b, a lower end of the first adhesive layer Dam does not protrude respect to the first spacing layer Rib1. In this way, the first adhesive layer Dam may enclose an area as large as possible while ensuring the water resistance of the first spacing layer Rib1, that is, the first panel region P may have an area as large as possible. In this way, a film layer in the first panel region P may also have an area as large as possible, which is conducive to reducing a requirement of the mother board for the display panel on the process accuracy, so that a production cost may be reduced.

Taking the mother board for the display panel shown in FIG. 2c as an example, the mother board for the display panel of the embodiments of the present disclosure will be described below with reference to FIG. 4a to FIG. 10.

Figure 4A:
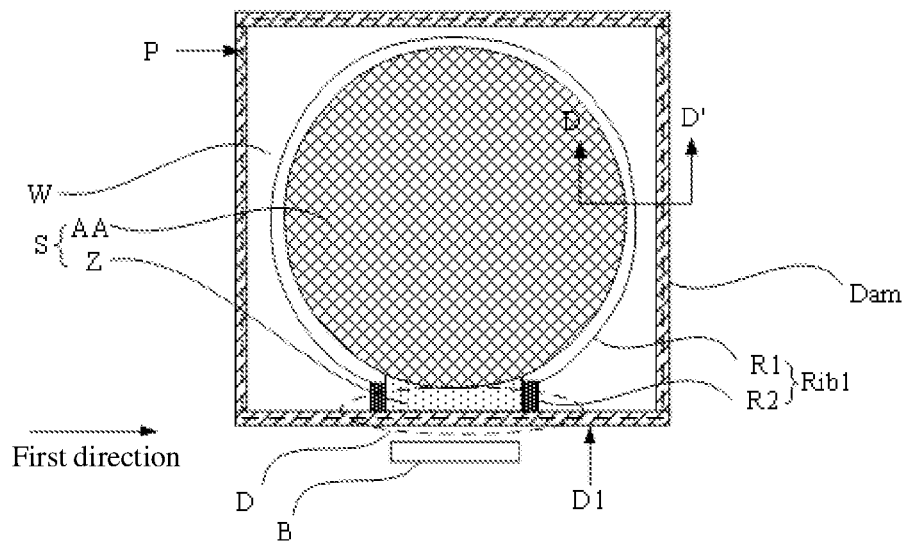
FIG. 4a schematically shows a plan view of a first panel region according to the embodiments of the present disclosure.
Figure 4B:
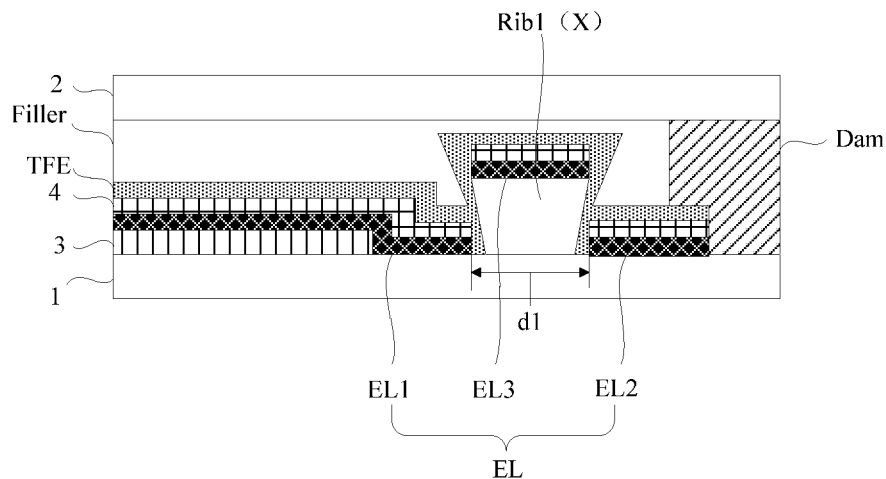
FIG. 4b schematically shows a first sectional view of FIG. 4a taken along a section line DD'.

FIG. 4a schematically shows a plan view of a first panel region according to the embodiments of the present disclosure. FIG. 4b schematically shows a first sectional view of FIG. 4a taken along a section line DD'. With reference to FIG. 4a and FIG. 4b, in the embodiments of the present disclosure, a material of the first adhesive layer Dam that plays a bonding role is generally soft. When the cover plate 2 is adhered to the base substrate 1, a portion of the first adhesive layer Dam may extend into the first panel region P under an action of pressure. In this case, a portion outside the first panel region P is a main body of the first adhesive layer Dam, which is adhered to the base substrate 1 and the cover plate 2, while the portion of the first adhesive layer Dam extending into the first panel region P may be adhered to a first encapsulation layer TFE mentioned below.

In some specific embodiments, the first light-emitting functional layer EL may include a first light-emitting functional sub-layer EL1 located in the retaining region S, a second light-emitting functional sub-layer EL2 located in the peripheral region W, and a third light-emitting functional sub-layer EL3 located between the retaining region S and the peripheral region W. The third light-emitting functional sub-layer EL3 is located on a side of the first spacing layer Rib1 away from the base substrate 1. The first light-emitting functional sub-layer EL1, the second light-emitting functional sub-layer EL2 and the third light-emitting functional sub-layer EL3 are spaced apart from each other. In other words, when forming the light-emitting functional layer EL, the first light-emitting functional layer EL is spaced by the first spacing layer Rib1 into three spaced parts, including the first light-emitting functional sub-layer EL1, the second light-emitting functional sub-layer EL2 and the third light-emitting functional sub-layer EL3, so that the first light-emitting functional layer EL in the retaining region S is spaced from the first light-emitting functional layer EL in the peripheral region W, and the water vapor intrusion path formed by the first light-emitting layer EL is cut off.

In some specific embodiments, the mother board for the display panel may further include a pixel circuit layer 3 and a pixel definition layer (not shown) arranged on a side of the first light-emitting functional layer EL close to the base substrate 1. The pixel definition layer is located between the first light-emitting functional layer EL and the pixel circuit layer 3. Optionally, the pixel circuit layer 3 includes a plurality of metal film layers and an insulation layer that separates at least some of the metal film layers from each other. The insulation layer in the pixel circuit layer 3 may extend to the edge of the retaining region S, and the first spacing layer Rib1 may be arranged on the insulation layer that extends to the edge of the retaining region S.

Optionally, the first spacing layer Rib1 may be arranged in the same layer as the pixel definition layer, which means that the first spacing layer Rib1 and the pixel definition layer are formed using the same film forming process. Alternatively, the first spacing layer Rib1 may be arranged in the same layer as one of the metal film layers in the pixel circuit layer 3. For example, the pixel circuit layer 3 includes a semiconductor layer, a first insulating layer, a gate layer, a second insulating layer, a source/drain electrode layer and the like that are sequentially arranged in the direction away from the base substrate 1, and the first spacing layer Rib1 is arranged in the same layer as the source/drain electrode layer, which means that the first spacing layer Rib1 and the source/drain electrode layer are formed using the same film forming process.

It should be noted that, in the embodiments of the present disclosure, the first spacing layer Rib1 may also be arranged in the same layer as another film layer or prepared through a separate film forming process, as long as the preparation process of the first spacing layer Rib1 is prior to the preparation process of the first light-emitting functional layer EL.

In some specific embodiments, the retaining region S includes a display region AA, and a distance d1 between an outer edge of the orthographic projection of the first spacing layer Rib1 on the base substrate 1 and an orthographic projection of the display region AA on the base substrate 1 is greater than or equal to 850 μm. For example, the distance between the outer edge of the orthographic projection of the first spacing layer Rib1 on the base substrate 1 and the orthographic projection of the display region AA on the base substrate 1 is greater than or equal to 950 μm. Optionally, the first spacing layer Rib1 may be strip-shaped, and a width of the first spacing layer Rib1 is greater than or equal to 850 μm. For example, the first spacing layer Rib1 may be strip-shaped, and the width of the first spacing layer Rib1 is greater than or equal to 950 μm. It should be noted that in the embodiments of the present disclosure, the outer edge of the orthographic projection of the first spacing layer Rib1 on the base substrate 1 refers to an edge of the orthographic projection of the first spacing layer Rib1 on the base substrate 1 on a side away from the orthographic projection of the display region AA on the base substrate 1.

Figure 4C:
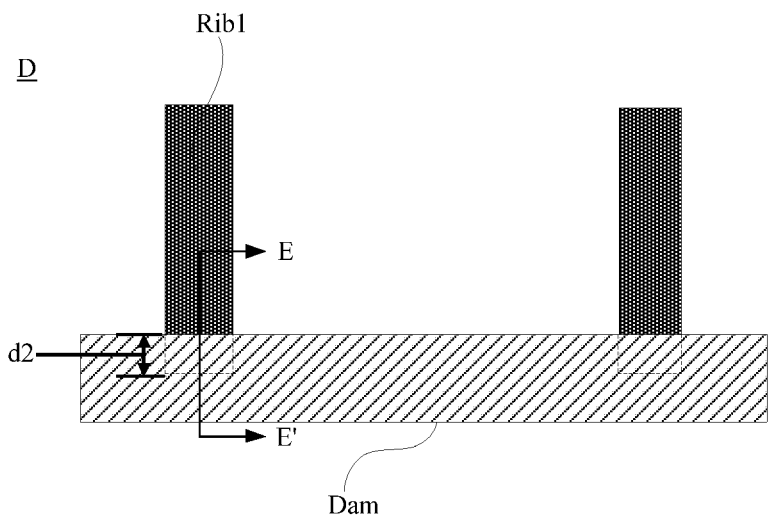
Figure 5:
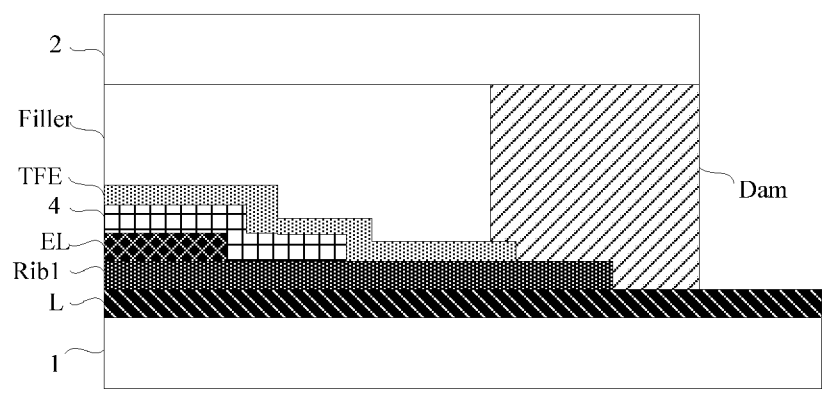
FIG. 5 schematically shows a sectional view of FIG. 4c taken along a section line EE'.

In some specific embodiments, the first spacing layer Rib1 includes a first partition part R1 and a second partition part R2, the first partition part R1 is arranged along an edge of the display region AA, and a first end of the second partition part R2 is connected to the first partition part R1. FIG. 4c schematically shows a first enlarged view at position D in FIG. 4a. for clarity, the first light-emitting functional layer EL on the side of the first spacing layer Rib1 away from the base substrate 1 is hidden in FIG. 4c. With reference to FIG. 4a and FIG. 4c, an orthographic projection of a second end of the second partition part R2 on the base substrate 1 partially overlaps with the first pattern, that is, the orthographic projection of the second end of the second partition part R2 on the base substrate 1 partially overlaps with the orthographic projection of the edge (the first edge D1) of the first adhesive layer Dam close to the bonding region B on the base substrate 1. The orthographic projection of the second end of the second partition part R2 on the base substrate 1 partially overlapping with the first pattern means that the orthographic projection of the second end of the second partition part R2 on the base substrate 1 partially coincides with the first pattern (that is, the two include a same region). FIG. 5 schematically shows a sectional view of FIG. 4c taken along a section line EE'. As shown in FIG. 5, the second end of the second partition part R2 is located between the first adhesive layer Dam and the base substrate 1.

In the embodiments of the present disclosure, in a process of preparing the mother board for the display panel, the first adhesive layer Dam may be formed on the cover plate 2 first, and then the cover plate 2 is adhered to the base substrate 1. In this process, the first adhesive layer Dam on the cover plate 2 may be pressed on the second partition part R2, so that the second end of the second partition part R2 is located between the first adhesive layer Dam and the base substrate 1. Optionally, an additional film layer may be further provided between the second end of the second partition part R2 and the first adhesive layer Dam, such as the first encapsulation layer TFE which will be mentioned below.

With reference to FIG. 4*a* and FIG. 4*b*, in some specific embodiments, the retaining region S further includes a wiring region Z arranged on a side of the display region AA close to the bonding region B, and the mother board for the display panel further includes a plurality of pixel units (not shown) located in the display region AA.

In the embodiments of the present disclosure, in a direction from the display region AA to the bonding region B, a size of the wiring region Z may be determined according to actual needs, which is not limited here. When the size of the wiring region Z is large in the direction from the display region AA to the bonding region B, the first end of the second partition part R2 is connected to an end of the first partition part R1 close to the bonding region B, and the second end of the second partition part R2 extends toward the bonding region B until the orthographic projection of the second end of the second partition part R2 on the base substrate 1 partially overlaps with the first pattern.

In the embodiments of the present disclosure, the plurality of pixel units may be arranged in an array, each pixel unit may further include a plurality of sub-pixels, and each sub-pixel may display a color. Each sub-pixel includes a light emitting device and a pixel circuit for providing a driving current to the light emitting device. For example, the light emitting device may be an organic light emitting diode (OLED) or a quantum dot light emitting diode (QLED) or the like. The light emitting device may include a first electrode 4, a second electrode (not shown), and the above-mentioned first light-emitting functional layer EL. The first light-emitting functional layer EL is arranged between the first electrode 4 and the second electrode, or the first electrode 4 and the second electrode are arranged on the same side of the first light-emitting functional layer EL. One of the first electrode 4 and the second electrode is an anode electrode, and the other is a cathode electrode. For example, the first electrode 4 may be the cathode electrode, and the second electrode may be the anode electrode. A material of the first electrode 4 may contain a conductive metal material, such as magnesium, aluminum, lithium and other metals and their alloys, or indium tin oxide (ITO), indium zinc oxide (IZO), and the like. A material of the second electrode may contain a transparent conductive material, such as indium tin oxide (ITO), indium zinc oxide (IZO), and the like.

In some specific embodiments, the first electrode 4 is arranged on a side of the first light-emitting functional layer EL away from the base substrate 1. The mother board for the display panel further includes a planarization layer (not shown) arranged on a side of the first electrode 4 away from the base substrate 1. The first electrode 4 and the planarization layer are both located in the first panel region P. In addition to the first light-emitting layer EL, the first electrode 4 and the planarization layer may also form the water vapor intrusion path, which may also lead to the package failure. In view of this, in some specific embodiments, the first electrode 4 in the retaining region S and the first electrode 4 in the peripheral region W are spaced by the first spacing layer Rib1, and the planarization layer in the retaining region S and the planarization layer in the peripheral region W are spaced by the first spacing layer Rib1. In other words, when forming the planarization layer and the first electrode 4, the planarization layer and the first electrode 4 are spaced into three parts by the first spacing layer Rib1 based on the same principle as the first light-emitting functional layer EL, so that the planarization layer and the first electrode 4 in the retaining region S are spaced from the planarization layer and the first electrode 4 in the peripheral region W, and the water vapor intrusion path formed by the planarization layer and the first electrode 4 may be cut off.

In some specific embodiments, the mother board for the display panel further includes a first encapsulation layer TFE arranged on a side of the planarization layer away from the base substrate 1, and the first encapsulation layer TFE extends continuously from the retaining region S to the peripheral region W.

In the embodiments of the present disclosure, the first encapsulation layer TFE further encapsulates an edge of the retaining region S close to the bonding region B, so that the edge of the retaining region S close to the bonding region B blocks water vapor through the first encapsulation layer TFE, and other edges of the retaining region S block water vapor through the first spacing layer Rib1. In other words, the first encapsulation layer TFE and the first spacing layer Rib1 may form a complete encapsulation structure, so as to prevent water vapor and oxygen from intruding an interior of the retaining region S. Optionally, the first encapsulation layer TFE may include a first encapsulation sub-layer, a second encapsulation sub-layer and a third encapsulation sub-layer that are sequentially arranged in a direction away from the base substrate 1. For example, the first encapsulation sub-layer and the third encapsulation sub-layer may be formed of an inorganic material, and the second encapsulation sub-layer may be formed of an organic material. Optionally, in the embodiments of the present disclosure, the first encapsulation sub-layer and the third encapsulation sub-layer may be prepared by a chemical vapor deposition process, and the second encapsulation layer may be prepared by an ink jet printing process. In this case, the mother board for the display panel may be further provided with a corresponding spacer structure, through which the organic material of ink jet printing may be prevented from overflowing to other regions.

Optionally, in some other specific embodiments, the first encapsulation layer TFE may include only the first encapsulation sub-layer, and the first encapsulation sub-layer may be prepared by a chemical vapor deposition process. In this case, the above-mentioned spacer structure may be omitted from the mother board for the display panel, so that a preparation process is simplified.

It should also be noted that an active driving or a passive driving may be adopted for the above-mentioned light emitting device. A passive drive OLED display substrate includes a cathode electrode and an anode electrode, an intersection of the anode electrode and the cathode electrode may emit light, and a driving circuit may be externally mounted by a connection method such as a tape carrier package or a chip-on-glass. An active drive OLED display substrate may provide each sub-pixel with a pixel circuit that is arranged in the above-mentioned pixel circuit layer 3. The pixel circuit may include a thin film transistor with a switching function (that is, a switching transistor), a thin film transistor with a driving function (that is, a driving transistor), and a storage capacitor. In addition, the pixel circuit may further include other types of thin film transistors with a compensation function. The pixel circuit operates under a control of a data voltage signal transmitted through a data line, and a gate scan signal and a light-emission control signal transmitted through a signal line to drive the light emitting device to emit light, so as to achieve operations such as display.

In some specific embodiments, the mother board for the display panel may further include various signal lines (not shown) arranged on the base substrate. The various signal lines include a data voltage signal line, a gate scanning signal line, a light-emission control signal line, a first power line, a second power line and so on, so as to provide each pixel circuit with various signals such as the data voltage signal, the gate scanning signal, the light-emission control signal, a first power voltage, a second power voltage and so on.

For example, the first power line may be a wire for providing a VSS voltage signal, and the second power line may be a wire for providing a VDD voltage signal. For example, the first power line is electrically connected to the first electrode 4 of the light emitting device, and the second power line is electrically connected to the second electrode of the light emitting device. It should be noted that "the second power line is electrically connected to the second electrode of the light emitting device" here may means that the second power line is electrically connected to the second electrode through an electronic element such as the thin film transistor in the pixel circuit.

In some specific embodiments, the mother board for the display panel further includes a connection signal line (not shown), and a first end of the connection signal line is connected to the pixel unit. For example, the first end of the connection signal line is connected to the pixel unit through the data voltage signal line. A second end of the connection signal line passes through the wiring region Z and is connected to a bonding end in the bonding region B. The second partition part R2 is located on a first side and a second side of the wiring region Z, and the first side and the second side of the wiring region Z are arranged in a first direction intersecting with a direction from the display region AA to the bonding region B. For example, the first direction is perpendicular to the direction from the display region AA to the bonding region B.

The first end of the connection signal line may be specifically connected to the pixel circuit of each sub-pixel. For example, the first end of the connection signal line may be connected to the pixel circuit of each sub-pixel through the data signal line arranged in the display region AA. The second end of the connection signal line is connected to the bonding end in the bonding region B, and the bonding end in the bonding region B is further used to connect with a driver chip. In this way, the driver chip may provide a driving signal to the pixel unit in the display region AA through the connection signal line, so that the pixel unit may display.

In the embodiments of the present disclosure, as shown in FIG. 4a, the second partition part R2 is arranged on the first side and the second side of the wiring region Z, that is, the second partition part R2 is arranged on left and right sides of the wiring region Z, so that the second partition part R2 may be located outside the wiring region Z, thus avoiding a structure of the second partition part R2 from affecting a layout of the connection signal line in the wiring region Z. For example, in the embodiments of the present disclosure, the connection signal line may be prepared first, and then the first spacing layer Rib1 may be prepared. In the wiring region Z, the connection signal line is located on a side of the second partition part R2 close to the base substrate 1, and some connection signal lines may be connected to structures in other film layers through a via hole. Since the second partition part R2 is located outside the wiring region Z, the second partition part R2 may not affect a trend of these connection signal lines.

As shown in FIG. 5, in some specific embodiments, the first adhesive layer Dam is adhered, near the wiring region Z, with a connection signal line L in addition to the base substrate 1.

As shown in FIG. 4c, in some specific embodiments, in the direction from the display region AA to the bonding region B, a size d2 of an overlapping portion between the orthographic projection of the second end of the second partition part R2 on the base substrate 1 and the first pattern is greater than or equal to 45 μm. For example, the size of the overlapping portion is greater than or equal to 50 μm.

Figure 6:
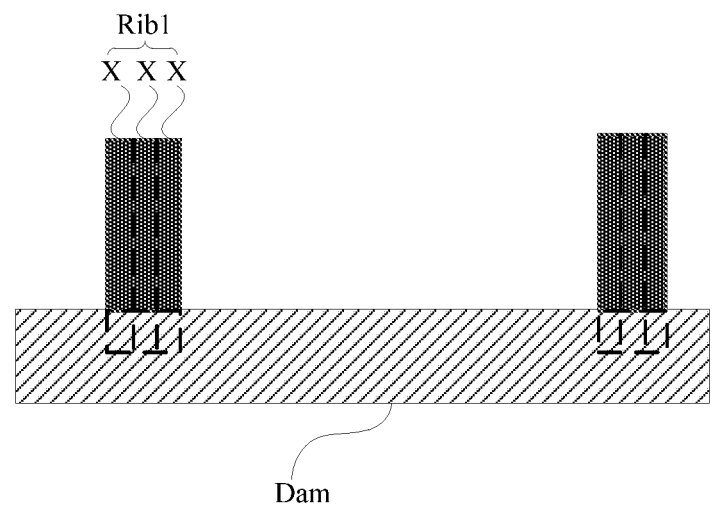

In some specific embodiments, the first spacing layer Rib1 is strip-shaped, the first spacing layer Rib1 includes at least one strip-shaped part, and each strip-shaped part may include the above-mentioned first partition part R1 and the second partition part R2. FIG. 6 schematically shows a second enlarged view at the position D in FIG. 4a. As shown in FIG. 6, in some specific embodiments, the first spacing layer Rib1 includes a plurality of strip-shaped parts X spaced apart from each other, and the plurality of strip-shaped parts X are arranged in a width direction of the first spacing layer Rib1. The first spacing layer Rib1 may have a better water resistance by the arrangement of the plurality of strip-shaped parts X.

The first spacing layer Rib1 including one strip-shaped part is illustrated below by way of example to describe the first spacing layer Rib1 of the embodiments of the present disclosure.

Figure 7:
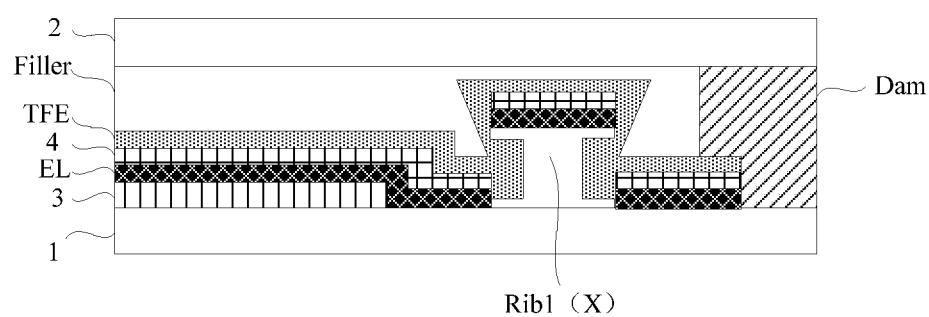
FIG. 7 schematically shows a second sectional view of FIG. 4a taken along the section line DD'.

FIG. 7 schematically shows a second sectional view of FIG. 4a taken along the section line DD'. With reference to FIG. 4a and FIG. 7, each strip-shaped part X includes a first portion on a side close to the cover plate 2, a second portion on a side close to the base substrate 1, and a third portion between the first portion and the second portion. A cross-sectional area of the first portion is larger than a cross-sectional area of the third portion.

In the embodiments of the present disclosure, when preparing the mother board for the display panel, the first spacing layer Rib1 may be formed first, and then the first light-emitting functional layer EL may be formed. When the first light-emitting functional layer EL is formed through an evaporation process, the first light-emitting functional layer EL may be easily spaced by the first spacing layer Rib1 since the cross-sectional area of the first portion of the strip-shaped part X is larger than the cross-sectional area of the third portion of the strip-shaped part X.

In some specific embodiments, a cross-sectional area of the second portion of the strip-shaped part X is larger than the cross-sectional area of the third portion of the strip-shaped part X. For example, as shown in FIG. 7, a longitudinal section of the strip-shaped part X is a "⊥"-shaped structure. Alternatively, the cross-sectional area of the second portion of the strip-shaped part X may be smaller than the cross-sectional area of the third portion of the strip-shaped part X. As shown in FIG. 4b, the longitudinal section of the strip-shaped part X is an inverted trapezoid structure. It should be noted that in the embodiments of the present disclosure, the longitudinal section of the strip-shaped part X refers to a longitudinal section obtained after the strip-shaped part X is sectioned in a second direction, and the second direction is an arrangement direction of two long sides of the strip-shaped part X, that is, a width direction of the strip-shaped part X.

In some specific embodiments, when the longitudinal section of the strip-shaped part X is the "⊥"-shaped structure, a material of the strip-shaped part X may include two (or more) metal materials, a sandwich structure is formed by the two metal materials, and the "⊥"-shaped structure is formed by using a characteristic that the two metal materials have different etching rates.

Exemplarily, in the embodiments of the present disclosure, the strip-shaped part X may be a stacked structure of molybdenum/aluminum/molybdenum materials, or a stacked structure of titanium/aluminum/titanium materials. The layers of the strip-shaped part X may also be formed of other materials, which is not specifically limited in the embodiments of the present disclosure. Since an etching rate of aluminum is greater than an etching rate of titanium or molybdenum in a process of wet etching, the above-mentioned "⊥"-shaped structure may be formed by performing a wet etching on a multi-layer structure such as the sandwich structure of titanium/aluminum/titanium or molybdenum/aluminum/molybdenum, a process is simple and a cost is low.

Figure 8:
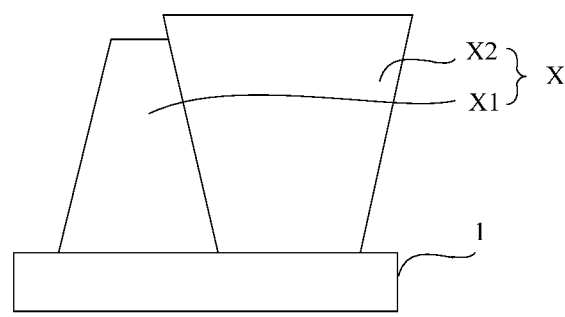
FIG. 8 schematically shows a schematic diagram of a first strip-shaped sub-part and a second strip-shaped sub-part according to the embodiments of the present disclosure.

In some specific embodiments, each strip-shaped part X includes a first strip-shaped sub-part and a second strip-shaped sub-part abutting the first strip-shaped sub-part. FIG. 8 schematically shows a schematic diagram of the first strip-shaped sub-part and the second strip-shaped sub-part according to the embodiments of the present disclosure. As shown in FIG. 8, the first strip-shaped sub-part X1 and the second strip-shaped sub-part X2 are arranged in the width direction of the first spacing layer Rib1. The second strip-shaped sub-part X2 protrudes with respect to a surface of the first strip-shaped sub-part X1 on a side of the first strip-shaped sub-part away from the base substrate 1.

In the embodiments of the present disclosure, the first strip-shaped sub-part X1 and the second strip-shaped sub-part X2 may be prepared by a two-step process. Since the second strip-shaped sub-part X2 protrudes with respect to the surface of the first strip-shaped sub-part X1 on the side of the first strip-shaped sub-part away from the base substrate 1, an upper surface of the strip part X may form a stepped structure, which is conducive to isolating the first light-emitting functional layer EL on one hand, and is conducive to increasing a bonding area so as to improve an adhesion on the other hand.

In some specific embodiments, a cross-sectional area of the first strip-shaped sub-part X1 gradually increases and a cross-sectional area of the second strip-shaped sub-part X2 gradually decreases in a direction close to the base substrate.

For example, as shown in FIG. 8, a longitudinal section of the first strip-shaped sub-part X1 is a regular trapezoid, and a longitudinal section of the second strip-shaped sub-part X2 is an inverted trapezoid. In the embodiments of the present disclosure, the longitudinal section of the first strip-shaped sub-part X1 and the longitudinal section of the second strip-shaped sub-part X2 refer to longitudinal sections obtained after the first strip-shaped sub-part X1 and the second strip-shaped sub-part X2 are sectioned in the second direction.

Figure 9:
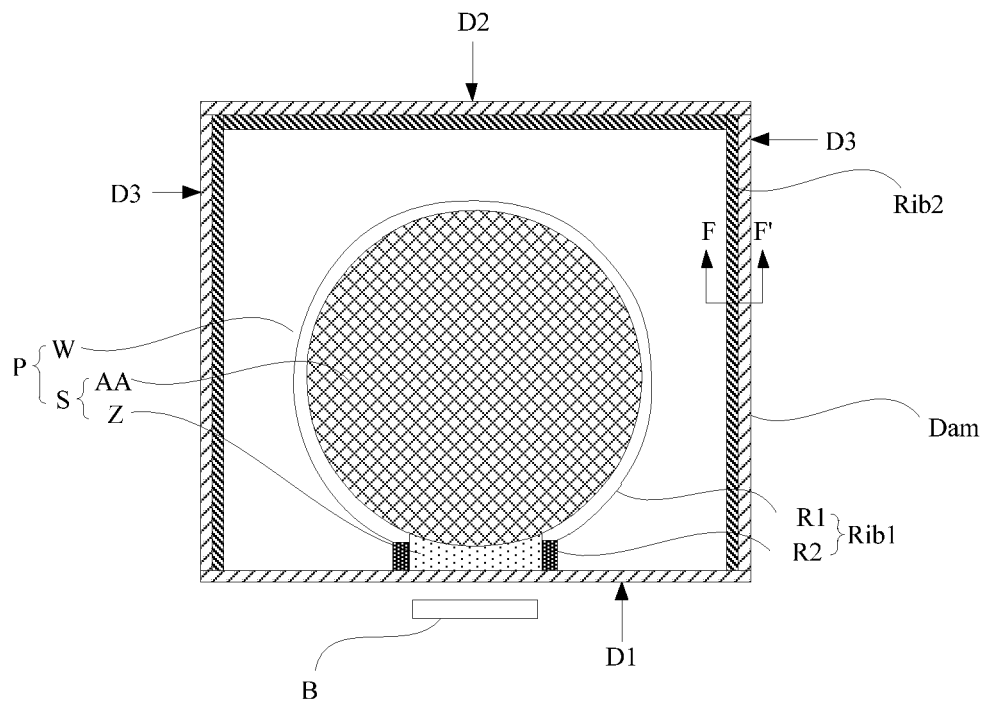
FIG. 9 schematically shows a schematic diagram of another first panel region according to the embodiments of the present disclosure.

FIG. 9 schematically shows a schematic diagram of another first panel region according to the embodiments of the present disclosure. As shown in FIG. 9, in some specific embodiments, the edge of the first adhesive layer Dam close to the bonding region B is the first edge D1. The first adhesive layer Dam further includes a second edge D2 arranged opposite to the first edge D1 and a third edge D3 located between the first edge D1 and the second edge D2. For example, the first adhesive layer Dam is a square ring structure, the first edge D1 of the first adhesive layer Dam is a lower edge of the first adhesive layer Dam, the second edge D2 is an upper edge of the first adhesive layer Dam, and the third edge D3 includes left and right edges of the first adhesive layer Dam. An orthographic projection of the first spacing layer Rib1 on the base substrate 1 partially overlaps with the first pattern, while the orthographic projection of the first spacing layer Rib1 on the base substrate 1 does not overlap with an orthographic projection of the second edge on the base substrate 1 and an orthographic projection of the third edge on the base substrate 1. As mentioned above, a package reliability of the first spacing layer Rib1 may be improved by partially overlapping the orthographic projection of the first spacing layer Rib1 on the base substrate 1 with the first pattern. On this basis, by not overlapping the orthographic projection of the first spacing layer Rib1 on the base substrate 1 with the orthographic projection of the second edge D2 on the base substrate 1 and the orthographic projection of the third edge D3 on the base substrate 1, an area enclosed by the first adhesive layer Dam may be further increased, so that the first panel region P may have a larger area, and a requirement for the accuracy of the preparation process may be reduced.

In some specific embodiments, the mother board for the display panel further includes a second adhesive layer Filler arranged between the cover plate 2 and the first encapsulation layer TFE, and the second adhesive layer Filler is located in the first panel region P. In the embodiments of the present disclosure, the second adhesive layer Filler may be located between the first encapsulation layer TFE and the cover plate 2, and evenly filled in the first panel region P, so as to adhere the first encapsulation layer TFE with the cover plate 2 together.

Figure 10:
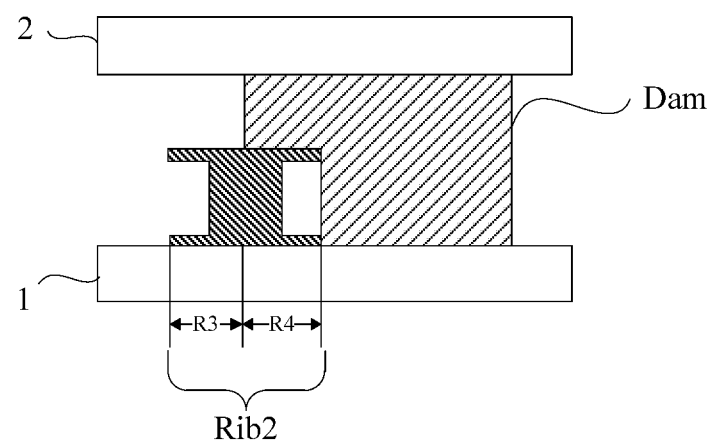
FIG. 10 schematically shows a sectional view of FIG. 9 taken along a section line FF'.

In some specific embodiments, the mother board for the display panel further includes a second spacing layer Rib2 arranged in the same layer as the first spacing layer Rib1. FIG. 10 schematically shows a sectional view of FIG. 9 taken along a section line FF'. For clarity, FIG. 10 only shows the base substrate 1, the second spacing layer Rib2, the first adhesive layer Dam and the cover plate 2. With reference to FIG. 9 and FIG. 10, the second spacing layer Rib2 includes a third partition part R3 and a fourth partition part R4 located on a side of the third partition part R3 away from the display region AA. The third partition part R3 is located in the peripheral region W. An orthographic projection of the fourth partition part R4 on the base substrate 1 overlaps with the orthographic projection of the second edge D2 on the base substrate 1 and the orthographic projection of the third edge on the base substrate 1, and the fourth partition part R4 is located between the base substrate 1 and the first adhesive layer Dam.

In the embodiments of the present disclosure, the first spacing layer Rib1 and the second spacing layer Rib2 being arranged in the same layer means that the first spacing layer Rib1 and the second spacing layer Rib2 are formed by using the same film forming process. An orthographic projection of the second spacing layer Rib2 on the base substrate 1 may be a continuous pattern or a discontinuous pattern, which may be determined according to actual needs. A shape of a longitudinal section of the second spacing layer Rib2 may be the same as a shape of a longitudinal section of the first spacing layer Rib1. For example, the longitudinal section of the second spacing layer Rib2 may be an inverted trapezoid structure. For another example, the shape of the longitudinal section of the second spacing layer Rib2 may be a "⊥"-shaped structure. Arranging the second spacing layer Rib2 in the peripheral region W is equivalent to providing more "protrusions" on the base substrate 1, which may increase a bonding area of the second adhesive layer Filler, so as to improve the adhesion. It should be noted that, in the embodiments of the present disclosure, the longitudinal section of the second spacing layer Rib2 refers to a longitudinal section obtained after the second spacing layer Rib2 is sectioned in a third direction. The third direction is an arrangement direction of two long sides of the second spacing layer Rib2, that is, a width direction of the second spacing layer Rib2.

Figure 11A:
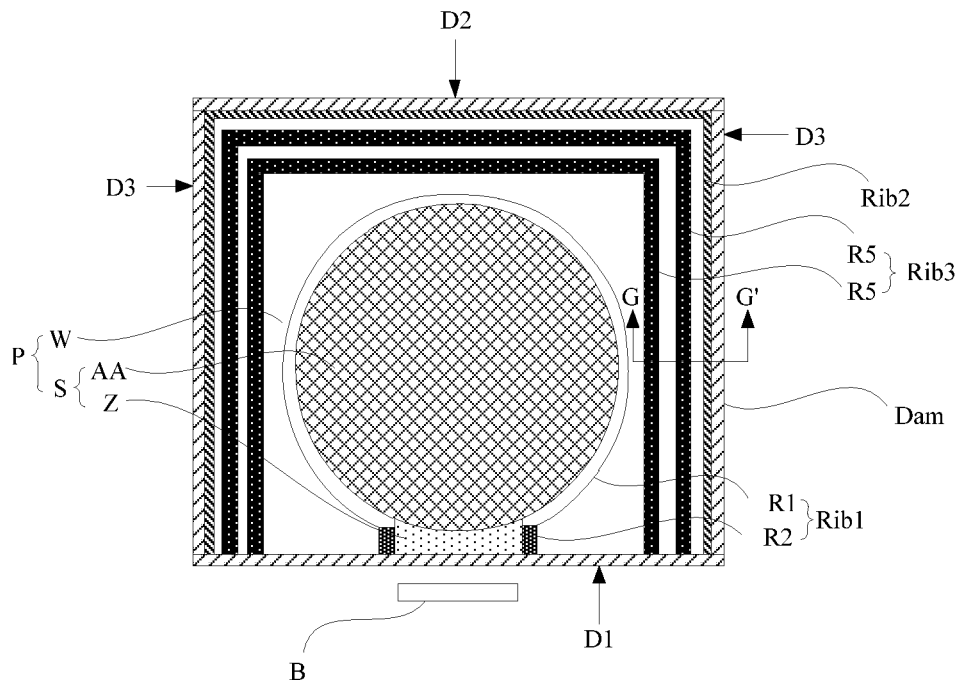
FIG. 11a and FIG. 11b schematically show schematic diagrams of yet another first panel region according to the embodiments of the present disclosure.
Figure 11B:
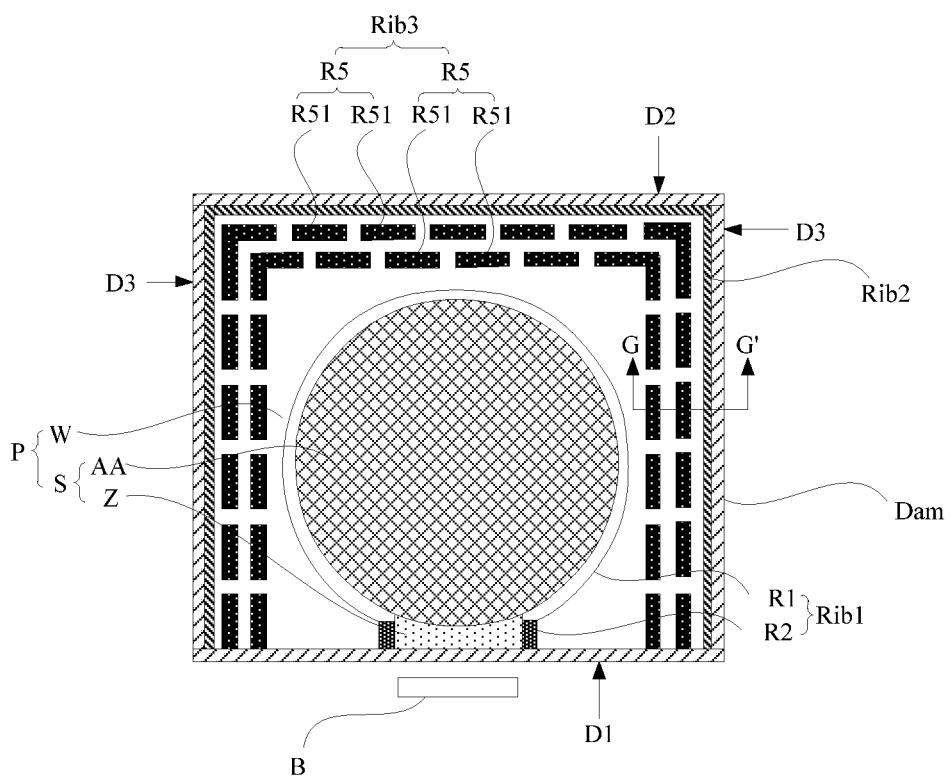
Figure 12:
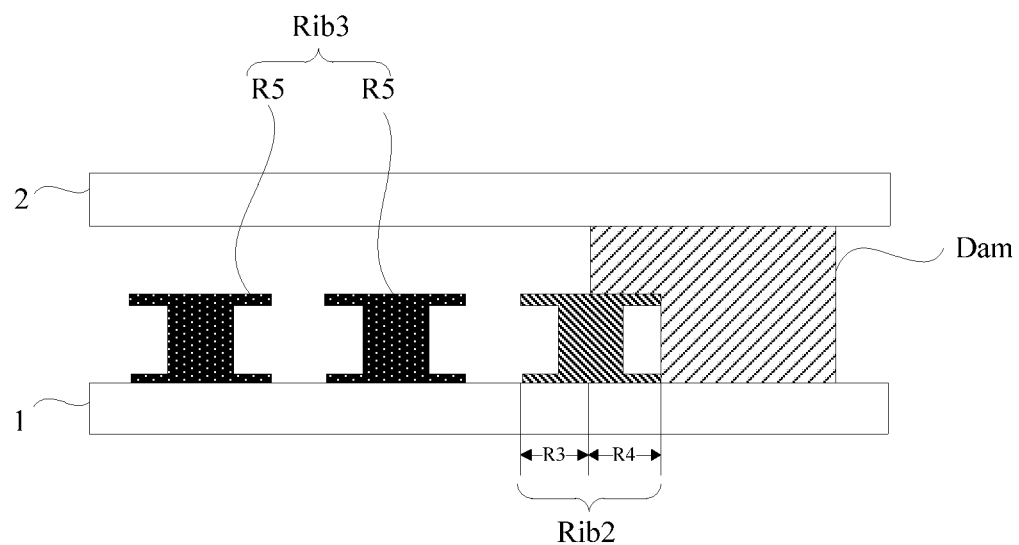
FIG. 12 schematically shows a sectional view of FIG. 11a and FIG. 11b taken along a section line GG'.

FIG. 11a and FIG. 11b schematically show schematic diagrams of yet another first panel region according to the embodiments of the present disclosure. FIG. 12 schematically shows a sectional view of FIG. 11a and FIG. 11b taken along a section line GG'. For clarity, FIG. 12 only shows the base substrate 1, the second spacing layer Rib2, a third spacing layer Rib3, the first adhesive layer Dam and the cover plate 2. With reference to FIG. 11 and FIG. 12, in some specific embodiments, the mother board for the display panel further includes a third spacing layer Rib3 arranged in the same layer as the first spacing layer Rib1, and the third spacing layer Rib3 is located in the peripheral region W. The third spacing layer Rib3 includes a plurality of fifth partition parts R5 nested with each other and spaced apart from each other. Arranging the third spacing layer Rib3 is equivalent to providing more "protrusions" on the base substrate 1, which may further increase the bonding area of the second adhesive layer Filler, so as to further improve the adhesion.

The first spacing layer Rib1 and the third spacing layer Rib3 being arranged in the same layer means that the first spacing layer Rib1 and the third spacing layer Rib3 are formed by using the same film forming process. An orthographic projection of the third spacing layer Rib3 on the base substrate may be a continuous pattern or a discontinuous pattern, which may be determined according to actual needs. For example, as shown in FIG. 11a, an orthographic projection of each fifth partition part R5 on the base substrate 1 is a continuous pattern. For example, as shown in FIG. 11b, each fifth partition part R5 includes a plurality of partition sub-parts R51 spaced from each other. A shape of a longitudinal section of the third spacing layer Rib3 may be the same as a shape of a longitudinal section of the first spacing layer Rib1. For example, the longitudinal section of the third spacing layer Rib3 may be an inverted trapezoid structure. For another example, the shape of the longitudinal section of the third spacing layer Rib3 may be a "⊥"-shaped structure. It should be noted that, in the embodiments of the present disclosure, the longitudinal section of the third spacing layer Rib3 refers to a longitudinal section obtained after the third spacing layer Rib3 is sectioned in a fourth direction. The fourth direction is an arrangement direction of two long sides of the third spacing layer Rib3, that is, a width direction of the third spacing layer Rib3.

A method of preparing a mother board for a display panel in the embodiments of the present disclosure will be described below. The preparation method of the embodiments of the present disclosure includes the following steps.

In S11, a pixel circuit layer 3 is prepared on a base substrate 1.

In S12, a pixel definition layer is formed on a side of the pixel circuit layer 3 away from the base substrate 1, and a first spacing layer Rib1 is formed at an edge of a retaining region S corresponding to a mother board for a display panel in a first panel region P.

In S13, a first light-emitting functional layer EL is formed on a side of the pixel definition layer away from the base substrate 1. The first light-emitting functional layer EL is located in the entire first panel region P, and the first light-emitting functional layer EL in the retaining region S is spaced from the first light-emitting functional layer EL in a peripheral region W by the first spacing layer Rib1.

In S14, a first electrode 4 is formed on a side of the first light-emitting functional layer EL away from the base substrate 1. The first electrode 4 is located in the entire first panel region P, and the first electrode 4 in the retaining region S is spaced from the first electrode 4 in the peripheral region W by the first spacing layer Rib1.

In S15, a planarization layer is formed on a side of the first electrode 4 away from the base substrate 1. The planarization layer is located in the entire first panel region P, and the planarization layer in the retaining region S is spaced from the planarization layer in the peripheral region W by the first spacing layer Rib1.

In the embodiments of the present disclosure, the first light-emitting functional layer EL, the first electrode 4 and the planarization layer may be prepared by an evaporation process.

In S16, a first encapsulation layer TFE is formed on a side of the planarization layer away from the base substrate 1. The first encapsulation layer TFE extends from the retaining region S to the peripheral region W. The first encapsulation layer TFE forms an encapsulation structure together with the first spacing layer Rib1 so as to separate devices in the retaining region S from an outside.

In the embodiments of the present disclosure, the first encapsulation layer TFE may be prepared by a CVD process.

In S17, a first adhesive layer Dam is coated at a position corresponding to the edge of the first panel region P on a cover plate 2.

In S18, a second adhesive layer Filler is coated in the first panel region P on the cover plate 2.

In S19, the cover plate 2 is attached to the base substrate 1, an orthographic projection of the first spacing layer Rib1 on the base substrate 1 is controlled to partially overlap with an orthographic projection of an edge of the first adhesive layer Dam close to the bonding region B on the base substrate 1, thus obtaining the mother board for the display panel according to the embodiments of the present disclosure.

It should be noted that in the method of preparing the mother board for the display panel described above, preparation processes of some film layers, such as the second electrode, is omitted for simplicity. In an actual preparation process, the omitted preparation processes of these film layers may be traditional preparation processes, which will not be described in detail here.

In some other specific embodiments, the preparation method of the embodiments of the present disclosure may further include the following steps.

In S21, a pixel circuit layer 3 is prepared on a base substrate 1. The pixel circuit layer 3 includes a source/drain metal layer. While preparing the source/drain metal layer, a first spacing layer Rib1 is formed at an edge of a retaining region S corresponding to a mother board for a display panel in a first panel region P.

In S22, a pixel definition layer is formed on a side of the pixel circuit layer 3 away from the base substrate 1.

In S23, a first light-emitting functional layer EL is formed on a side of the pixel definition layer away from the base substrate 1. The first light-emitting functional layer EL is located in the entire first panel region, and the first light-emitting functional layer EL in the retaining region S is spaced from the first light-emitting functional layer EL in a peripheral region W by a first spacing layer Rib1.

In S24, a first electrode 4 is formed on a side of the first light-emitting functional layer EL away from the base substrate 1. The first electrode 4 is located in the entire first panel region P. and the first electrode 4 in the retaining region S is spaced from the first electrode 4 in the peripheral region W by the first spacing layer Rib1.

In S25, a planarization layer is formed on a side of the first electrode 4 away from the base substrate 1. The planarization layer is located in the entire first panel region P, and the planarization layer in the retaining region S is spaced from the planarization layer in the peripheral region W by the first spacing layer Rib1.

In the embodiments of the present disclosure, the first light-emitting functional layer EL, the first electrode 4 and the planarization layer may be prepared by an evaporation process.

In S26, a first encapsulation layer TFE is formed on a side of the planarization layer away from the base substrate 1. The first encapsulation layer TFE extends from the retaining region S to the peripheral region W. The first encapsulation layer TFE forms an encapsulation structure together with the first spacing layer Rib1 so as to separate devices in the retaining region S from an outside.

In the embodiments of the present disclosure, the first encapsulation layer TFE may be prepared by a CVD process.

In S27, a first adhesive layer Dam is coated at a position corresponding to the edge of the first panel region P on a cover plate 2.

In S28, a second adhesive layer Filler is coated in the first panel region P on the cover plate 2.

In S29, the cover plate 2 is attached to the base substrate 1, an orthographic projection of the first spacing layer Rib on the base substrate 1 is controlled to partially overlap with an orthographic projection of an edge of the first adhesive layer Dam close to the bonding region B on the base substrate 1, thus obtaining the mother board for the display panel according to the embodiments of the present disclosure.

It should be noted that the preparation methods described above are only two of the preparation methods in the present disclosure. In some specific embodiments, it is possible to form the first spacing layer Rib1 having the structure described above when preparing the first spacing layer Rib1, or prepare the second spacing layer Rib2 and/or the third spacing layer Rib3 while preparing the first spacing layer Rib1. The specific structures of the above-mentioned various film layers have been described in detail. For example, the longitudinal section of the first spacing layer Rib1 may be an inverted trapezoid structure or a "⊥"-shaped structure, which will not be described in detail here.

It should be noted that, in the embodiments of the present disclosure, the first encapsulation layer TFE may include a first encapsulation sub-layer, a second encapsulation sub-layer and a third encapsulation sub-layer that are sequentially arranged in the direction away from the base substrate 1. For example, the first encapsulation sub-layer and the third encapsulation sub-layer may be formed of an inorganic material, and the second encapsulation sub-layer may be formed of an organic material. Optionally, in the embodiments of the present disclosure, the first encapsulation sub-layer and the third encapsulation sub-layer may be prepared by a chemical vapor deposition process, and the second encapsulation layer may be prepared by an ink jet printing process. In this case, the mother board for the display panel may be further provided with a corresponding spacer structure through which the organic material of ink jet printing is prevented from overflowing to other regions.

Optionally, in some other specific embodiments, the first encapsulation layer TFE may include only the first encapsulation sub-layer, and the first encapsulation sub-layer may be prepared by a chemical vapor deposition process. In this case, the above-mentioned spacer structure may be omitted from the mother board for the display panel, so that a preparation process is simplified.

It should be noted that FIG. 2a to FIG. 12 provided by the embodiments of the present disclosure only show some film layers closely related to the embodiments of the present disclosure. Other film layers, such as the pixel definition layer and the anode layer, are omitted for a clear presentation. The omitted film layers may be arranged in a traditional mode, which will not be described in detail here.

Figure 13A:
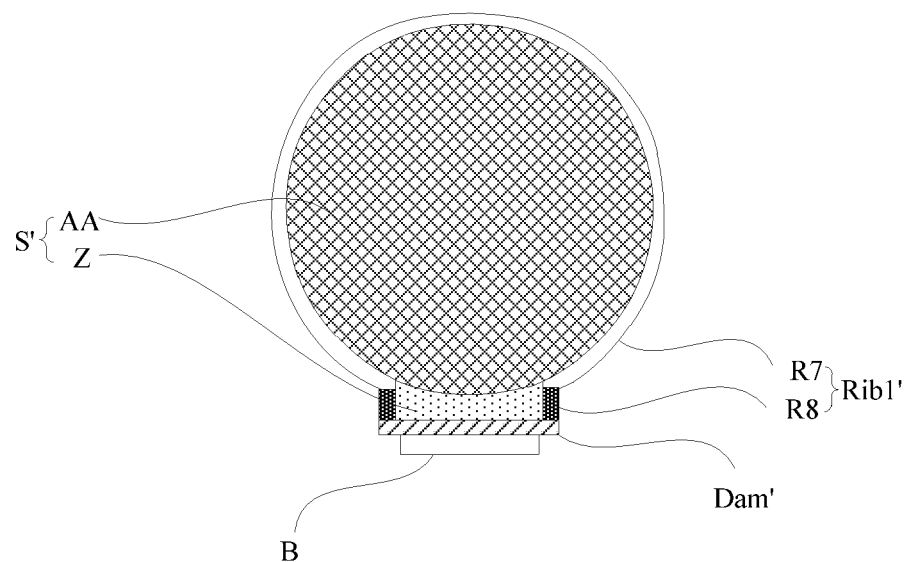
FIG. 13a schematically shows a first schematic diagram of a display panel according to the embodiments of the present disclosure.

The embodiments of the present disclosure further provide a display panel. FIG. 13a schematically shows a first schematic diagram of a display panel according to the embodiments of the present disclosure. As shown in FIG. 13a, the display panel has a second panel region S' and a bonding region B located on a side of the second panel region S'. The display panel includes: a base substrate, a cover plate arranged opposite to the base substrate, a second light-emitting functional layer, a second spacing layer Rib1', and a third adhesive layer Dam' arranged between the base substrate and the cover plate. The third adhesive layer Dam' is located between the second panel region S' and the bonding region B, and is adhered to the cover plate and the base substrate. The second light-emitting functional layer is located in the second panel region S'. An orthographic projection of the second spacing layer Rib1' on the base substrate partially overlaps with an orthographic projection of the third adhesive layer Dam' on the base substrate, and the two may enclose to form a third pattern which is a closed pattern. The orthographic projection of the second spacing layer Rib1' on the base substrate does not exceed an edge of the orthographic projection of the third adhesive layer Dam' on the base substrate on a side away from an orthographic projection of the second panel region S' on the base substrate.

In the embodiments of the present disclosure, the display panel may be obtained by cutting the mother board for the display panel in the above-mentioned embodiments. For example, when cutting the mother board for the display panel to obtain the display panel, a rough cutting may be performed along a region defined by the first panel region P and the bonding region B to obtain an initial display panel, and then a fine cutting and a grinding may be performed on the initial display panel to remove the peripheral region W and the first adhesive layer Dam arranged around the peripheral region W, thus obtaining the display panel of the embodiments of the present disclosure. For example, the third adhesive layer Dam' is obtained after cutting the first adhesive layer Dam. Specifically, after the fine cutting is performed on the mother board for the display panel, a portion of the first adhesive layer Dam between the retaining region S and the bonding region B is retained, which is the third adhesive layer Dam'. The second light-emitting functional layer is obtained after cutting the first light-emitting functional layer EL. Specifically, a portion of the first light-emitting functional layer EL in the retaining region S is retained, which is the second light-emitting functional layer. After the fine cutting is performed, the first spacing layer Rib1 in the mother board for the display panel may be retained. In other words, the second spacing layer Rib1 of the display panel may be substantially the same as the first spacing layer Rib1 in the mother board for the display panel.

In some specific embodiments, the second panel region S' includes a display region AA. The second spacing layer Rib1' includes a sixth partition part R6 and a seventh partition part R7. The sixth partition part R6 is arranged along an edge of the display region AA. A first end of the seventh partition part R7 is connected to the sixth partition part R6. An orthographic projection of a second end of the seventh partition part R7 on the base substrate 1' partially overlaps with the orthographic projection of the third adhesive layer Dam' on the base substrate 1'. The second end of the seventh partition part R7 is located between the third adhesive layer Dam' and the base substrate 1'.

In some specific embodiments, the second panel region S' further includes a wiring region Z arranged on a side of the display region AA close to the bonding region B. The display panel further includes a plurality of pixel units and connection signal lines. The plurality of pixel units are located in the display region AA. A first end of the connection signal line is connected to the pixel unit, and the other end of the connection signal line passes through the wiring region Z and is connected to a bonding end in the bonding region B. The seventh partition part R7 is located on a first side and a second side of the wiring region Z, and the first side and the second side of the wiring region Z are arranged in a first direction intersecting a direction from the display region AA to the bonding region B, that is, the seventh partition part R7 is located outside the wiring region Z, so as to prevent the second partition part Rib1' from affecting a layout of wires in the wiring region Z.

Figure 13B:
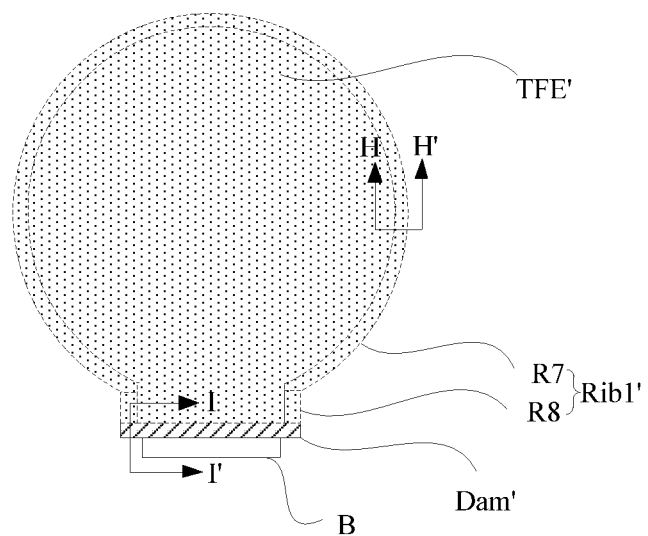
FIG. 13b schematically shows a second schematic diagram of a display panel according to the embodiments of the present disclosure.

FIG. 13b schematically shows a second schematic diagram of the display panel according to the embodiments of the present disclosure. As shown in FIG. 13b, in some specific embodiments, the display panel further includes a second encapsulation layer TFE' arranged on a side of the second light-emitting functional layer away from the base substrate 1'. The second encapsulation layer TFE' is obtained after cutting the first encapsulation layer TFE. In other words, after the fine cutting is performed on the above-mentioned mother board for the display panel, a portion of the first encapsulation layer TFE in the retaining region S is retained, which is the second encapsulation layer TFE'.

Figure 14A:
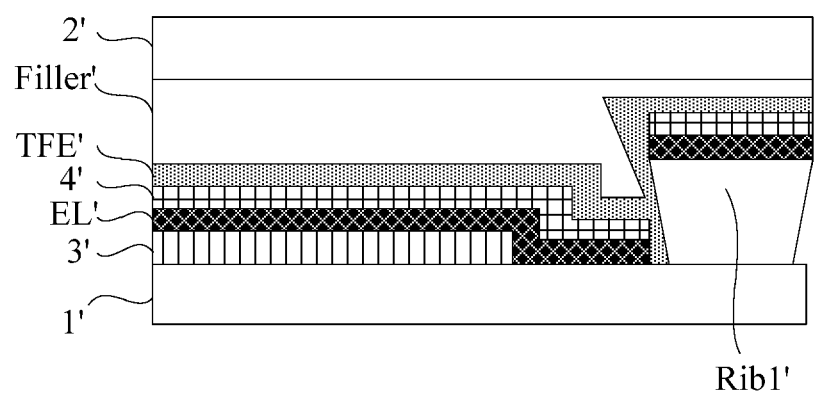
FIG. 14a schematically shows a sectional view of FIG. 13b taken along a section line HH'.
Figure 14B:
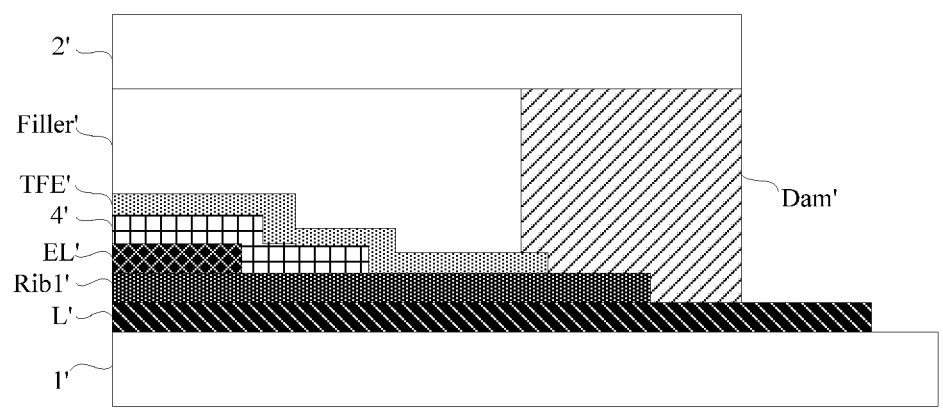
FIG. 14b schematically shows a sectional view of FIG. 13b taken along a section line II'.

FIG. 14a schematically shows a sectional view of FIG. 13b taken along a section line HH', and FIG. 14b schematically shows a sectional view of FIG. 13b taken along a section line II'. With reference to FIG. 13a to FIG. 14b, the display panel of the embodiments of the present disclosure includes a pixel circuit 3', a second light-emitting functional layer EL', a first electrode 4', a second encapsulation layer TFE', and a second adhesive layer Filler', which are sequentially arranged in a direction away from the base substrate 1'. The base substrate 1', the pixel circuit 3', the first electrode 4' and the second adhesive layer Filler' refer to portions of corresponding film layers in the mother board for the display panel retained after cutting the mother board for the display panel. In the embodiments of the present disclosure, the second encapsulation layer TFE' and the second spacing layer Rib1' form an encapsulation structure of the display panel, and the encapsulation structure separates the second light-emitting functional layer in the display panel from the outside.

In the embodiments of the present disclosure, in a process of cutting the mother board for the display panel to obtain the display panel, the second spacing layer Rib1' may effectively improve the water resistance of the display panel, cut off the water vapor intrusion path formed due to that a light-emitting functional layer in a special-shaped display panel is needed to extend to the periphery of the display panel, and avoid a package failure of the display panel. Furthermore, after the display panel is obtained by cutting, the second spacing layer Rib1' may also play an encapsulation role, and cooperate with the second encapsulation layer TFE' to form the encapsulation structure of the display panel, so as to separate the second light-emitting functional layer and other film layers in the display panel from the outside and protect the devices in the display panel.

It should be noted that FIG. 13a to FIG. 14 provided by the embodiments of the present disclosure only show some film layers closely related to the embodiments of the present disclosure. Other film layers, such as the pixel definition layer and the anode layer, are omitted for a clear presentation. The omitted film layers may be arranged in a traditional mode, which will not be described in detail here.

The present disclosure further provides a display device including the display panel as described above.

In other embodiments of the present disclosure, examples of the display device include a tablet personal computer (PC), a smart phone, a personal digital assistant (PDA), a portable multimedia player, a game console, or a wrist watch-type electronic device, etc. However, the embodiments of the present disclosure are not intended to limit a type of the display device. In some exemplary embodiments, the display device may be used not only in a large electronic device such as a television (TV) or an external billboard, but also in a medium or small electronic device such as a PC, a laptop computer, a vehicle navigation device, a camera or the like.

Those skilled in the art may understand that features described in various embodiments of the present disclosure and/or claims may be combined in various ways, even if such combinations are not explicitly described in the present disclosure. In particular, features described in the various embodiments of the present disclosure and/or claims may be combined in various ways without departing from the spirit and teachings of the present disclosure. All these combinations fall within the scope of the present disclosure.

The embodiments of the present disclosure have been described above. However, these embodiments are for illustrative purposes only, and are not intended to limit the scope of the present disclosure. Although various embodiments have been described separately above, this does not mean that measures in the various embodiments may not be used in combination advantageously. The scope of the present disclosure is defined by the appended claims and their equivalents. Those skilled in the art may make various substitutions and modifications without departing from the scope of the present disclosure, and these substitutions and modifications should all fall within the scope of the present disclosure.

What is claimed is:

1. A mother board for a display panel, the mother board for the display panel having a first panel region and a bonding region on a side of the first panel region, wherein the first panel region has a retaining region and a peripheral region located outside the retaining region; the mother board for the display panel comprising:
   a base substrate,
   a cover plate arranged opposite to the base substrate,
   a first light-emitting functional layer,
   a first adhesive layer, and
   a first spacing layer arranged between the base substrate and the cover plate;

wherein the first light-emitting functional layer is located in the first panel region;

wherein the first adhesive layer surrounds the first panel region and is adhered to the cover plate and the base substrate, and an orthographic projection of an edge of the first adhesive layer on a side of the first adhesive layer close to the bonding region on the base substrate defines a first pattern; and wherein the first spacing layer is located at an edge of the retaining region, and the first light-emitting functional layer in the retaining region is spaced from the first light-emitting functional layer in the peripheral region by the first spacing layer, an orthographic projection of the first spacing layer on the base substrate partially overlaps with the first pattern and forms a second pattern with the first pattern; wherein the second pattern is a closed pattern, and the orthographic projection of the first spacing layer on the base substrate is located within a range of a pattern defined by an orthographic projection of the first adhesive layer on the base substrate.

2. The mother board for the display panel according to claim 1, wherein the retaining region comprises a display region;

wherein the first spacing layer comprises a first partition part and a second partition part, the first partition part is arranged along an edge of the display region, a first end of the second partition part is connected to the first partition part, and an orthographic projection of a second end of the second partition part on the base substrate partially overlaps with the first pattern; and wherein the second end of the second partition part is located between the first adhesive layer and the base substrate.

3. The mother board for the display panel according to claim 2, wherein the retaining region further comprises a wiring region arranged on a side of the display region close to the bonding region, the mother board for the display panel further comprises a plurality of pixel units and connection signal lines, the plurality of pixel units are located in the display region, a first end of the connection signal line is connected to the pixel unit, and the other end of the connection signal line passes through the wiring region and is connected to a bonding end in the bonding region; and wherein the second partition part is located on a first side and a second side of the wiring region, the first side and the second side of the wiring region are arranged in a first direction intersecting a direction from the display region to the bonding region.

4. The mother board for the display panel according to claim 2, wherein in the direction from the display region to the bonding region, a size of an overlapping portion between the orthographic projection between of the second end of the second partition part on the base substrate and the first pattern is greater than or equal to 45 µm.

5. The mother board for the display panel according to claim 1, wherein the edge of the first adhesive layer close to the bonding region is a first edge, the first adhesive layer further comprises a second edge arranged opposite to the first edge and a third edge located between the first edge and the second edge, and the orthographic projection of the first spacing layer on the base substrate does not overlap with an orthographic projection of the second edge on the base substrate and an orthographic projection of the third edge on the base substrate.

6. The mother board for the display panel according to claim 5, further comprising a second spacing layer arranged in the same layer as the first spacing layer, wherein the second spacing layer comprises a third partition part and a fourth partition part located on a side of the third partition part away from the display region, the third partition part is located in the peripheral region, an orthographic projection of the fourth partition part on the base substrate overlaps with the orthographic projection of the second edge on the base substrate and the orthographic projection of the third edge on the base substrate, and the fourth partition part is located between the base substrate and the first adhesive layer.

7. The mother board for the display panel according to claim 1, wherein the first spacing layer is strip-shaped, the first spacing layer comprises at least one strip-shaped part, and each strip-shaped part comprises a first portion on a side close to the cover plate, a second portion on a side close to the base substrate, and a third portion located between the first portion and the second portion; and wherein a cross-sectional area of the first portion is larger than a cross-sectional area of the third portion.

8. The mother board for the display panel according to claim 7, wherein the number of the strip-shaped part is more than one, the strip-shaped parts are spaced apart from each other, and the strip-shaped parts are arranged in a width direction of the first spacing layer, and wherein:

a cross-sectional area of the second portion is greater than the cross-sectional area of the third portion; or a cross-sectional area of the second portion is smaller than the cross-sectional area of the third portion.

9. The mother board for the display panel according to claim 7, wherein each strip-shaped part comprises a first strip-shaped sub-part and a second strip-shaped sub-part abutting the first strip-shaped sub-part, and the first strip-shaped sub-part and the second strip-shaped sub-part are arranged in a width direction of the first spacing layer; and wherein the second strip-shaped sub-part protrudes with respect to a surface of the first strip-shaped sub-part on a side of the first strip-shaped sub-part away from the base substrate.

10. The mother board for the display panel according to claim 9, wherein a cross-sectional area of the first strip-shaped sub-part gradually increases and a cross-sectional area of the second strip-shaped sub-part gradually decreases in a direction close to the base substrate.

11. The mother board for the display panel according to claim 1, further comprising a third spacing layer arranged in the same layer as the first spacing layer, wherein the third spacing layer is located in the peripheral region, and the third spacing layer comprises a plurality of fifth partition parts nested with each other and spaced apart from each other.

12. The mother board for the display panel according to claim 11, wherein each fifth partition part comprises a plurality of partition sub-parts spaced apart from each other; or an orthographic projection of each fifth partition part on the base substrate is a continuous pattern.

13. The mother board for the display panel according to claim 1, further comprising a pixel circuit layer and a pixel definition layer arranged on a side of the first light-emitting functional layer close to the base substrate, wherein the pixel definition layer is located between the first light-emitting functional layer and the pixel circuit layer;

wherein the first spacing layer is arranged in the same layer as the pixel definition layer; or the first spacing layer is arranged in the same layer as one of metal film layers in the pixel circuit layer;

wherein a distance between an outer edge of the orthographic projection of the first spacing layer on the base substrate and an orthographic projection of the display region on the base substrate is greater than or equal to 850 µm;

wherein the first light-emitting functional layer comprises a first light-emitting functional sub-layer located in the retaining region, a second light-emitting functional sub-layer located in the peripheral region, and a third light-emitting functional sub-layer located between the retaining region and the peripheral region;

wherein the third light-emitting functional sub-layer is located on a side of the first spacing layer away from the base substrate, and the first light-emitting functional sub-layer, the second light-emitting functional sub-layer and the third light-emitting functional sub-layer are spaced apart from each other;

wherein the retaining region comprises a display region and a wiring region arranged on a side of the display region close to the bonding region;

wherein the mother board for the display panel further comprises a plurality of pixel units and connection signal lines, the plurality of pixel units are located in the display region, a first end of the connection signal line is connected to the pixel unit, and a second end of the connection signal line passes through the wiring region and is connected to a bonding end in the bonding region; and wherein the first adhesive layer is further adhered to the connection signal line.

14. The mother board for the display panel according to claim 1, further comprising: a first electrode arranged on a side of the first light-emitting functional layer away from the base substrate, and a planarization layer arranged on a side of the first electrode away from the base substrate, wherein the first electrode and the planarization layer are located in the first panel region; and wherein the first electrode in the retaining region is spaced from the first electrode in the peripheral region by the first spacing layer, and the planarization layer in the retaining region is spaced from the planarization layer in the peripheral region by the first spacing layer.

15. The mother board for the display panel according to claim 14, further comprising a first encapsulation layer arranged on a side of the planarization layer away from the base substrate, wherein the first encapsulation layer extends continuously from the retaining region to the peripheral region.

16. The mother board for the display panel according to claim 15, further comprising a second adhesive layer arranged between the cover plate and the first encapsulation layer, wherein the second adhesive layer is located in the first panel region.

17. A display panel, the display panel having a second panel region and a bonding region on a side of the second panel region;

wherein the display panel comprises: a base substrate, a cover plate arranged opposite to the base substrate, a second light-emitting functional layer, a second spacing layer, and a third adhesive layer arranged between the base substrate and the cover plate;

wherein the third adhesive layer is located between the second panel region and the bonding region and is adhered to the cover plate and the base substrate, the second light-emitting functional layer is located in the second panel region, the second spacing layer is located at an edge of the second panel region, an orthographic projection of the second spacing layer on the base substrate partially overlaps with an orthographic projection of the third adhesive layer on the base substrate and the orthographic projection of the second spacing layer on the base substrate and the orthographic projection of the third adhesive layer on the base substrate enclose to form a third pattern, wherein the third pattern is a closed pattern, and the orthographic projection of the second spacing layer on the base substrate does not exceed an edge of the orthographic projection of the third adhesive layer on the base substrate on a side away from an orthographic projection of the second panel region on the base substrate.

18. The display panel according to claim 17, wherein the second panel region comprises a display region;

wherein the second spacing layer comprises a sixth partition part and a seventh partition part, the sixth partition part is arranged along an edge of the display region, a first end of the seventh partition part is connected to the sixth partition part, and an orthographic projection of a second end of the seventh partition part on the base substrate partially overlaps with the orthographic projection of the third adhesive layer on the base substrate;

wherein the second end of the seventh partition part is located between the third adhesive layer and the base substrate; and wherein the display panel further comprises: a second encapsulation layer arranged on a side of the second light-emitting functional layer away from the base substrate, wherein the second encapsulation layer and the second spacing layer form an encapsulation structure of the display panel, and the encapsulation structure is configured to separate the second light-emitting functional layer in the display panel from an outside.

19. The display panel according to claim 18, wherein the second panel region further comprises a wiring region arranged on a side of the display region close to the bonding region, the display panel further comprises a plurality of pixel units and connection signal lines, the plurality of pixel units are located in the display region, a first end of the connection signal line is connected to the pixel unit, and the other end of the connection signal line passes through the wiring region and is connected to a bonding end in the bonding region; and wherein the seventh partition part is located on a first side and a second side of the wiring region, the first side and the second side of the wiring region are arranged in a first direction intersecting a direction from the display region to the bonding region.

20. A display device comprising the display panel according to claim 17.

* * * * *